(12) United States Patent
Mikami et al.

(10) Patent No.: US 8,480,946 B2
(45) Date of Patent: Jul. 9, 2013

(54) IMPRINT METHOD AND TEMPLATE FOR IMPRINTING

(75) Inventors: Shinji Mikami, Kanagawa (JP); Ikuo Yoneda, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 208 days.

(21) Appl. No.: 12/398,479

(22) Filed: Mar. 5, 2009

(65) Prior Publication Data
US 2009/0224436 A1    Sep. 10, 2009

(30) Foreign Application Priority Data
Mar. 6, 2008    (JP) .................................. 2008-56394

(51) Int. Cl.
*B29C 33/40* (2006.01)
*B29C 33/46* (2006.01)
*B29C 35/08* (2006.01)

(52) U.S. Cl.
USPC ........... 264/496; 264/293; 264/284; 264/447; 264/494; 977/855; 977/887; 977/859

(58) Field of Classification Search
USPC .................. 977/887, 855, 859; 264/447, 293, 264/284, 494, 496
See application file for complete search history.

(56) References Cited

U.S. PATENT DOCUMENTS

| | | | |
|---|---|---|---|
| 5,437,946 A * | 8/1995 | McCoy | 430/5 |
| 5,597,613 A | 1/1997 | Galarneau et al. | |
| 5,914,205 A * | 6/1999 | Theuwissen | 430/5 |
| 2001/0055733 A1 * | 12/2001 | Irie et al. | 430/396 |
| 2004/0124566 A1 * | 7/2004 | Sreenivasan et al. | 264/494 |
| 2006/0144275 A1 | 7/2006 | Kolesnychenko et al. | |
| 2006/0192320 A1 * | 8/2006 | Tokita et al. | 264/293 |
| 2006/0273488 A1 * | 12/2006 | Seki et al. | 264/293 |
| 2007/0054097 A1 * | 3/2007 | Suehira et al. | 428/195.1 |
| 2007/0200276 A1 | 8/2007 | Mackey et al. | |
| 2008/0106001 A1 * | 5/2008 | Slafer | 264/310 |

FOREIGN PATENT DOCUMENTS

| | | |
|---|---|---|
| EP | 1072954 A2 * | 7/2000 |
| JP | 6-302501 | 10/1994 |
| JP | 2000-194142 | 7/2000 |
| JP | 2001-68411 | 3/2001 |

(Continued)

OTHER PUBLICATIONS

Yoneda, et al., "Imprint System and Imprint Method", U.S. Appl. No. 12/237,435, filed Sep. 25, 2008.

(Continued)

*Primary Examiner* — Milton I Cano
*Assistant Examiner* — Jeremiah Smith
(74) *Attorney, Agent, or Firm* — Finnegan, Henderson, Farabow, Garrett & Dunner, L.L.P.

(57) ABSTRACT

An imprint method, in which pattern forming is performed by having a light curable material applied on a sample face of a substrate being a processing target hardened by being exposed to light in a state where the light curable material and a pattern formed surface of a template contact each other, the pattern formed surface having a concave-convex pattern formed thereon; wherein in one exposure performed with respect to a predetermined shot of the light curable material, an exposure amount at a light curable material on a first region which contacts a pattern formed region including the concave-convex pattern of the template is greater than an exposure amount at a light curable material on a second region which at least contacts a part of a pattern periphery region of the template, the pattern periphery region existing in a periphery of the pattern formed region of the template.

10 Claims, 17 Drawing Sheets

FOREIGN PATENT DOCUMENTS

| | | |
|---|---|---|
| JP | 2005-286062 | 10/2005 |
| JP | 2007-19466 | 1/2007 |
| JP | 2007-103924 | 4/2007 |
| JP | 2007-266053 | 10/2007 |
| JP | 2009-23113 | 2/2009 |
| JP | 2009-60085 | 3/2009 |
| WO | WO 00/59012 | 10/2000 |

OTHER PUBLICATIONS

Notice of Rejection issued by the Japanese Patent Office on Jul. 13, 2010, for Japanese Patent Application No. 2008-056394, and English-language translation thereof.

* cited by examiner

IMPRINT METHOD AND TEMPLATE FOR IMPRINTING

CROSS-REFERENCE TO RELATED APPLICATIONS

This application is based upon and claims the benefit of priority from the prior Japanese Patent Application No. 2008-56394, filed on Mar. 6, 2008; the entire contents of which are incorporated herein by reference.

BACKGROUND OF THE INVENTION

1. Field of the Invention

The present invention relates to an imprint method for pattern forming in a semiconductor manufacturing process, and to a template for imprinting.

2. Description of the Related Art

In recent years, along with a progress of down-sizing of a semiconductor device, problems that may occur in a photolithography process used in the manufacturing process of the semiconductor device have become more apparent. That is, in the recent leading-edge rules for designing a semiconductor device based on half-pitch, a pitch size has been reduced down to 22 nm. However, with a conventional lithography technique where a miniaturized pattern is exposed to light, it is difficult to achieve resolution to the extent that complies with the latest design rule. Consequently, it has become difficult to form a miniaturized pattern to such an extent that meets the latest design rule. From this perspective, as disclosed in Japanese Patent Application Laid-Open No. 2001-68411, and Japanese Patent Application Laid-Open No. 2000-194142, for instance, a nano-imprint technique has been proposed as a patterning technique that can be an alternative to the lithography technique.

According to the nano-imprint technique, a master plate (i.e. a template) with a pattern to be printed being formed is pressed on an organic material having been applied on a substrate being a processing target. In such condition, the organic material is exposed to light, whereby the exposed organic material is to harden, eventually enabling the pattern to be printed in the organic material layer on the substrate. Therefore, according to the nano-imprint technique, variation factors such as focal depth, aberration, exposure amount, etc. which have been problems in the conventional lithography process can be reduced, as a result of which patterning can be executed simply and with high accuracy.

According to the nano-imprint technique, a desired pattern can be formed by repeating sequential patterning processes of applying the organic material, contacting the template and the organic material, and hardening the organic material, with respect to each pattern printing region. However, when a comparatively thick hardened organic material portion in the pattern printed region (also referred to as a shot) where the pattern has already been formed by the organic material being hardened extends into an adjacent shot as being a patterning target, downward movement of the template as performed in patterning of the adjacent shot lying next to the target shot may be interfered with the hardened organic material. When the downward movement of the template is interfered, the template and the organic material will not be able to contact sufficiently with each other in the pattern printing region as being a patterning target. As a result, printing deficiency may occur.

For this reason, in the conventional nano-imprint technique, in order to prevent the hardened organic material, where patterning has already been completed, from extending into the adjacent shot regions, gaps of several hundred micrometers are provided among respective shot regions. Therefore, the whole substrate surface cannot be used effectively for pattern formation, and the number of shots which can be formed on the substrate is to be limited.

BRIEF SUMMARY OF THE INVENTION

An imprint method according to an embodiment of the present invention, in which pattern forming is performed by having a light curable material applied on a sample face of a substrate being a processing target hardened by being exposed to light in a state where the light curable material and a pattern formed surface of a template contact each other, the pattern formed surface having a concave-convex pattern formed thereon; wherein in one exposure performed with respect to a predetermined shot of the light curable material, an exposure amount at a light curable material on a first region which contacts a pattern formed region including the concave-convex pattern of the template is greater than an exposure amount at a light curable material on a second region which at least contacts a part of a pattern periphery region of the template, the pattern periphery region existing in a periphery of the pattern formed region of the template.

An imprint method according to an embodiment of the present invention, in which pattern is executed by multiple shots for printing patterns on a pattern forming surface of a substrate being a processing target, the imprint method comprises: contacting a template to a light curable material applied on a first shot among the multiple shots in order to print an element pattern on the light curable material, the template including a pattern formed region which includes a concave-convex pattern for the element pattern printing formed on a face to be contacting with the light curable material and a pattern periphery region existing in a periphery of the pattern formed region of the template; and hardening a light curable material on a first region which contacts the pattern formed region of the template by exposing the substrate to light through the template in a state where the light curable material and the template contact each other, an exposure amount at the light curable material on the first region in one exposure being greater than an exposure amount at a light curable material on a second region which at least contacts a part of the pattern periphery region of the template.

A template for imprinting according to an embodiment of the present invention comprises: a pattern formed region including a concave-convex pattern for element pattern printing; and a pattern periphery region existing in a periphery of the pattern formed region, a transmittance of the pattern periphery region being less than a transmittance of a concave pattern in the concave-convex pattern.

BRIEF DESCRIPTION OF THE DRAWINGS

FIG. 5-1 is a schematic sectional view (Phase 1) showing one example of procedures in patterning processes executed by the nano-imprint apparatus shown in FIG. 1;

FIG. 5-2 is a schematic sectional view (Phase 2) showing one example of procedures in the patterning processes executed by the nano-imprint apparatus shown in FIG. 1;

FIG. 5-3 is a schematic sectional view (Phase 3) showing one example of procedures in the patterning processes executed by the nano-imprint apparatus shown in FIG. 1;

FIG. 5-4 is a schematic sectional view (Phase 4) showing one example of procedures in the patterning processes executed by the nano-imprint apparatus shown in FIG. 1;

FIG. 5-5 is a schematic sectional view (Phase 5) showing one example of procedures in the patterning processes executed by the nano-imprint apparatus shown in FIG. 1;

FIG. 5-6 is a schematic sectional view (Phase 6) showing one example of procedures in the patterning processes executed by the nano-imprint apparatus shown in FIG. 1;

FIG. 5-7 is a schematic sectional view (Phase 7) showing one example of procedures in the patterning processes executed by the nano-imprint apparatus shown in FIG. 1;

FIG. 5-8 is a schematic sectional view (Phase 8) showing one example of procedures in the patterning processes executed by the nano-imprint apparatus shown in FIG. 1;

FIG. 5-9 is a schematic sectional view (Phase 9) showing one example of procedures in the patterning processes executed by the nano-imprint apparatus shown in FIG. 1;

FIG. 5-10 is a schematic sectional view (Phase 10) showing one example of procedures in the patterning processes executed by the nano-imprint apparatus shown in FIG. 1;

FIG. 5-11 is a schematic sectional view (Phase 11) showing one example of procedures in the patterning processes executed by the nano-imprint apparatus shown in FIG. 1;

FIG. 5-12 is a schematic sectional view (Phase 12) showing one example of procedures in the patterning processes executed by the nano-imprint apparatus shown in FIG. 1;

FIG. 6 is a substrate plane view for illustrating a state of an organic material as being hardened through a patterning process according to the conventional art;

FIG. 7 is a substrate sectional view for illustrating the state of the organic material as being hardened through the patterning process according to the conventional art;

FIG. 8 is a substrate sectional view for illustrating a shot arrangement according to the conventional art;

FIG. 9 is a substrate sectional view for illustrating a state of a template as moving downward, in the nano-imprint apparatus shown in FIG. 1;

FIG. 10 is a schematic diagram showing another example of the structure of the nano-imprint machine according to the first embodiment;

FIG. 11-1 is a schematic sectional view (Phase 1) showing one example of procedures in patterning processes executed by the nano-imprint apparatus according to another example of the structure of the nano-imprint apparatus according to the first embodiment;

FIG. 11-2 is a schematic sectional view (Phase 2) showing one example of procedures in the patterning processes executed by the nano-imprint apparatus according to another example of the structure of the nano-imprint apparatus according to the first embodiment;

FIG. 12 is a schematic diagram showing one example of a structure of a nano-imprint apparatus according to a second embodiment;

FIG. 14-1 is a schematic sectional view (Phase 1) showing one example of procedures in patterning processes executed by the nano-imprint apparatus shown in FIG. 12;

FIG. 14-2 is a schematic sectional view (Phase 2) showing one example of procedures in the patterning processes executed by the nano-imprint apparatus shown in FIG. 12;

FIG. 14-3 is a schematic sectional view (Phase 3) showing one example of procedures in the patterning processes executed by the nano-imprint apparatus shown in FIG. 12;

FIG. 14-4 is a schematic sectional view (Phase 4) showing one example of procedures in the patterning processes executed by the nano-imprint apparatus shown in FIG. 12;

FIG. 14-5 is a schematic sectional view (Phase 5) showing one example of procedures in the patterning processes executed by the nano-imprint apparatus shown in FIG. 12;

FIG. 14-6 is a schematic sectional view (Phase 6) showing one example of procedures in the patterning processes executed by the nano-imprint apparatus shown in FIG. 12;

DETAILED DESCRIPTION OF THE INVENTION

Exemplary embodiments of an imprint method and a template for imprinting according to the present invention will be explained below in detail with reference to the accompanying drawings. The present invention is not limited to the following embodiments. Furthermore, it is to be understood that sectional views of the template used in describing the following embodiments are given for illustrative purposes, and therefore, relations among thicknesses and widths of layers, ratio of thicknesses of layers, etc. are different from what they actually are in practice. Moreover, the thicknesses of layers as will be shown in the following embodiments are examples, and therefore, the actual thicknesses of layers are not to be limited by such examples.

First Embodiment

A first embodiment of the present invention will be described. According to the first embodiment, exposing time for a region corresponding to a pattern periphery region of a substrate is adjusted, for instance, by shutting out light by a shutter (which is a light shielding member) for a predetermined period of time.

Figure 1:
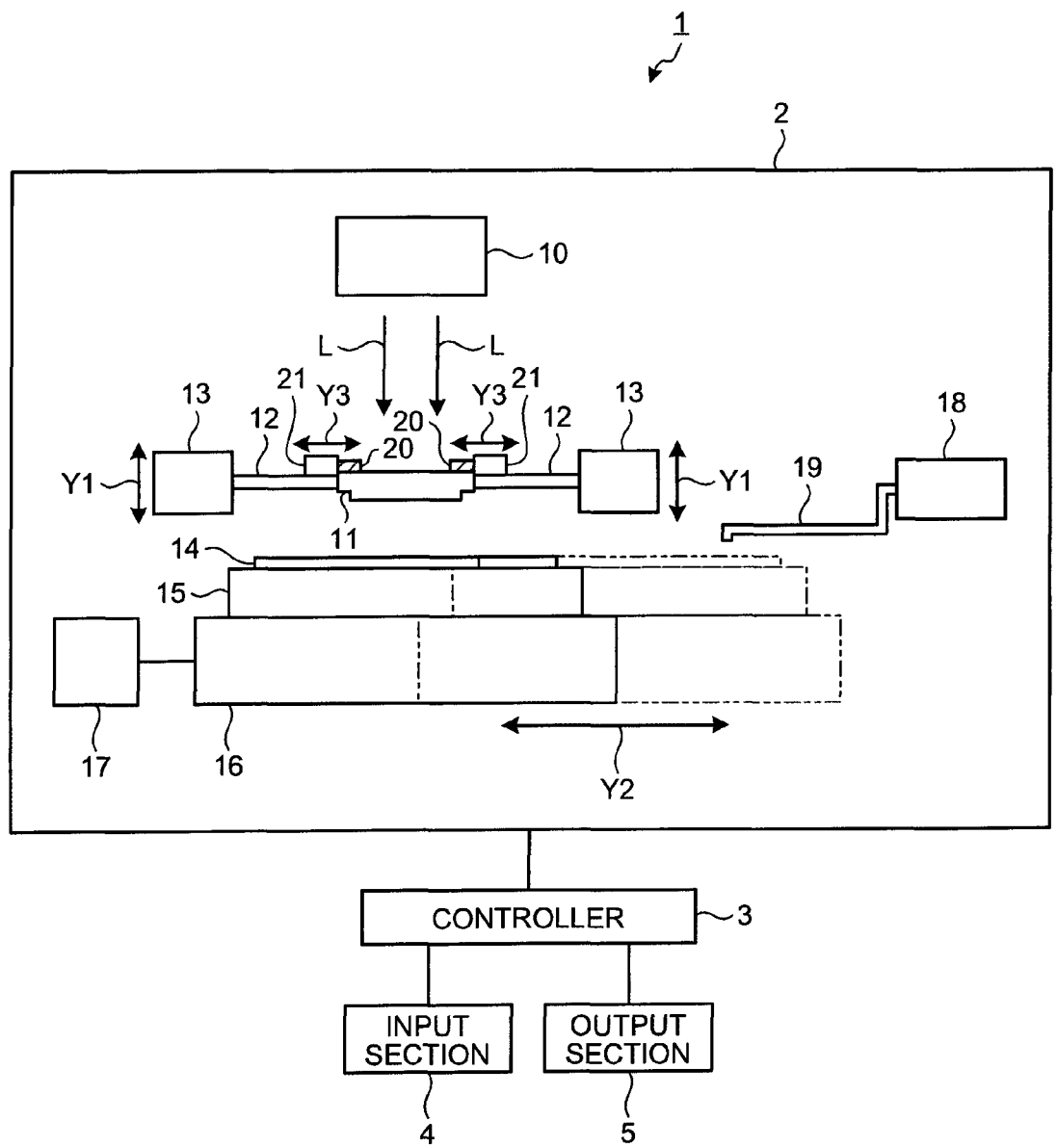
FIG. 1 is a schematic diagram showing one example of a structure of a nano-imprint apparatus according to a first embodiment of the present invention.

FIG. 1 is a schematic view showing one example of a structure of a nano-imprint apparatus according to the first embodiment of the present invention. As shown in FIG. 1, the nano-imprint apparatus 1 according to the first embodiment includes a nano-imprint machine 2, a controller 3, an input section 4, and an output section 5. The nano-imprint machine 2 executes pattern printing on a substrate 14 using the nano-imprint technique, the substrate 14 being a sample. The controller 3 controls an operation of each of the constructing parts of the nano-imprint apparatus 1. The input section 4 inputs instruction regarding processing operation of the nano-imprint apparatus 1 to the controller 3. The output section 5 outputs processing information of the nano-imprint apparatus 1.

The nano-imprint machine 2 includes: a light source 10 which emits ultraviolet light that hardens an organic material being a light curable material; a template 11 of which surface has a concave-convex pattern being formed for element pattern printing; template holders 12 for holding the template 11; elevation units 13 provided in a way corresponding to the template holders 12, each elevation unit 13 functioning to move the corresponding template holder 12 up/down in order to move the template 11 up/down in a way indicated by arrows Y1; a substrate holder 15 for holding the substrate 14; a substrate moving unit 16 which moves the substrate holder 15 in order to move the substrate 14 in a way indicated by an arrow Y2; a substrate moving driver 17 for driving the substrate moving unit 16; a container 18 for storing the organic material to be applied on the surface of the substrate 14; and a coating unit 19 for applying the organic material in the container 18 on a shot being a pattern printing target at the substrate 14. The template holders 12 hold the template 11 in such a way that the concave-convex patterned surface of the template 11 is to face parallel to a pattern forming surface of the substrate 14.

Furthermore, the nano-imprint machine 2 has a shutter 20 and a shutter moving unit 21. The shutter 20 is arranged on the other surface of the template 11 opposite to the concave-convex patterned surface, and is capable of shutting out the ultraviolet light emitted from the light source 10. The shutter moving unit 21 moves the shutter 20. The shutter moving unit 21 moves the shutter 20 along a surface parallel to the surface of the substrate 14 as well as the concave-convex patterned surface of the template 11, in a way indicated by arrows Y3. The shutter 20 and the shutter moving unit 21 will move up and down along with the template 11 and the template holders 12.

Figure 2:
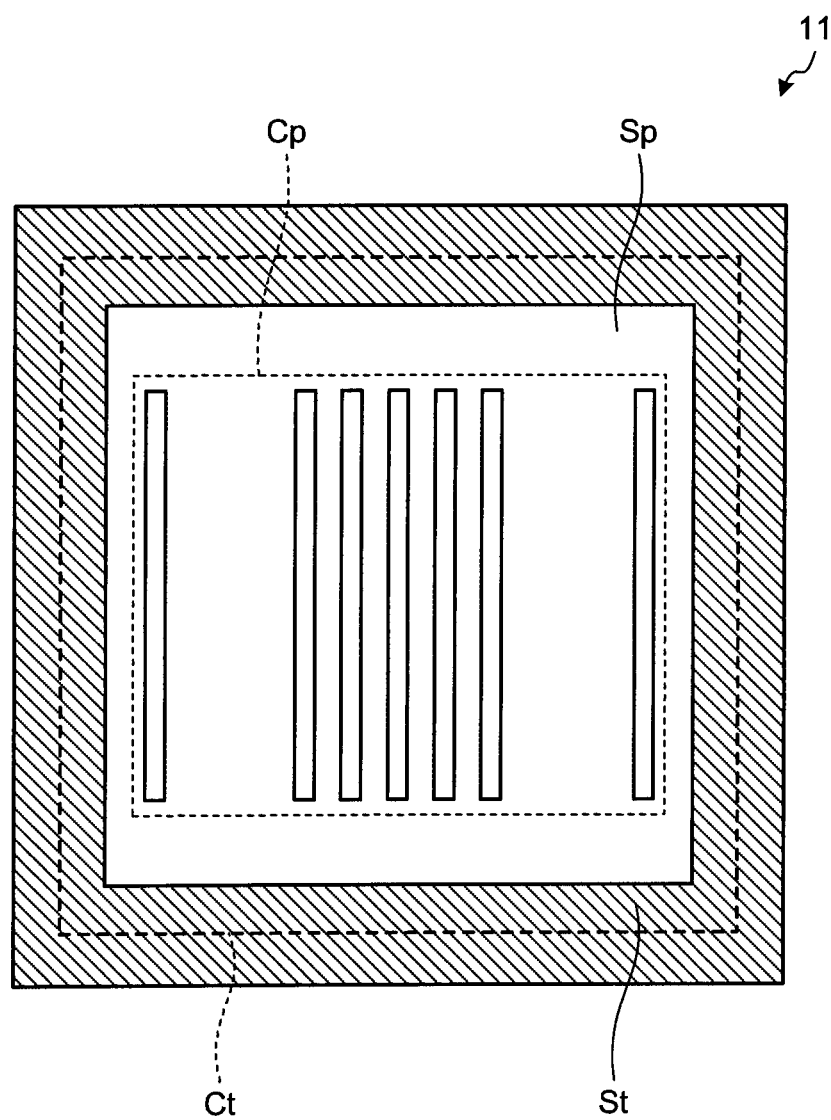
FIG. 2 is a diagram showing a concave-convex patterned surface of a template shown in FIG. 1.

Now, the template 11 will be described. FIG. 2 is a diagram showing the concave-convex patterned surface of the template 11. As shown in FIG. 2, the concave-convex patterned surface of the template 11 is formed as being wider than a pattern printing region periphery Ct that corresponds to one shot region of the substrate 14. The concave-convex patterned surface of the template 11 includes a pattern formed region Sp and a pattern periphery region St which exists in a periphery of the pattern formed region Sp. The pattern formed region Sp further includes a patterned region Cp where a semiconductor element pattern, an alignment mark pattern for superposition in the adjacent lithography processes and a concave-convex pattern corresponding to other patterns required in manufacturing the semiconductor element are formed. The pattern formed region Sp, for instance, is a region about 5 to 10 µm inside the pattern printing region periphery Ct. In the substrate 14, a region that comes underneath the pattern periphery region St of the template 11 is a region which is to be exposed to light from the light source 10 also in patterning processes directed to the adjacent shot regions.

Figure 3:
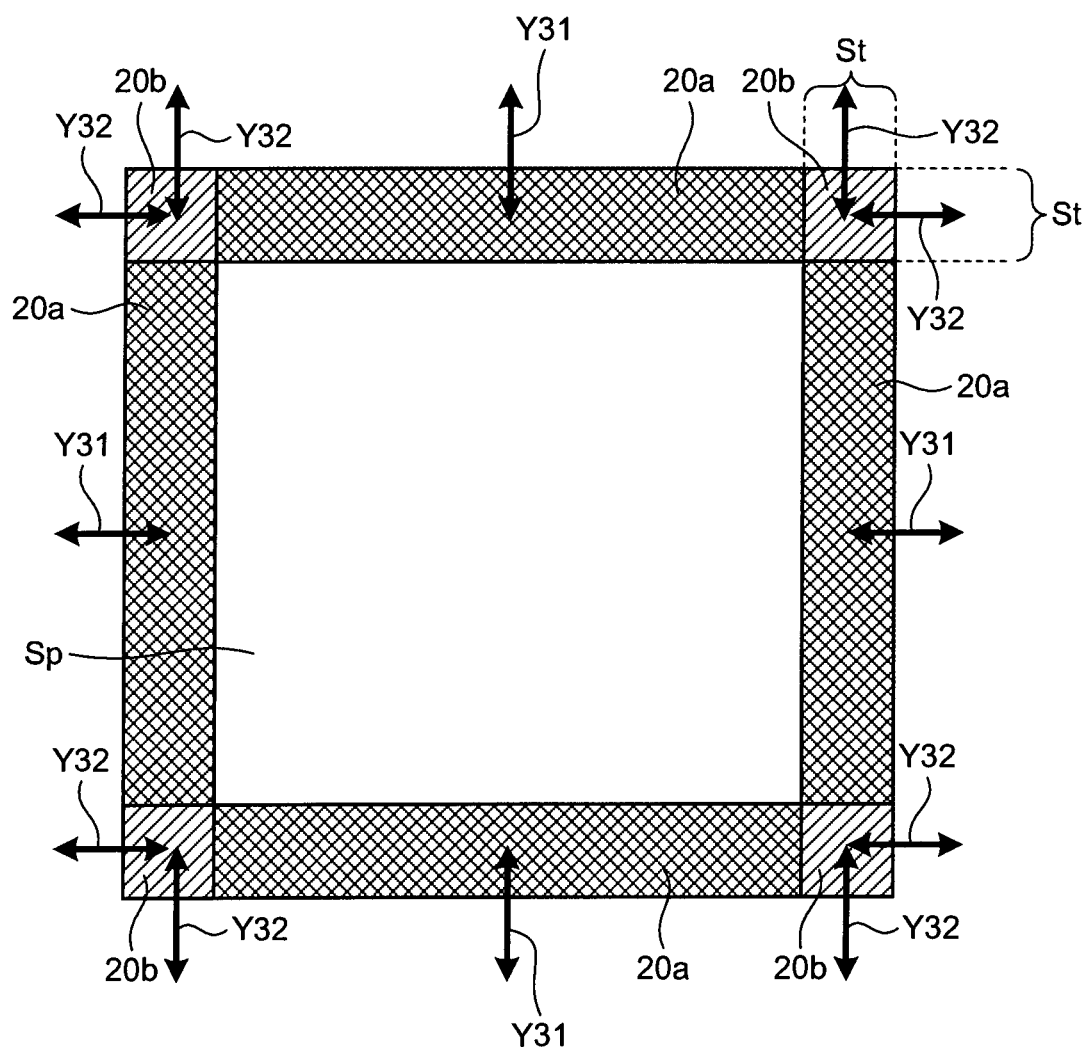
FIG. 3 is a plane view of a shutter shown in FIG. 1 when viewed from above.

The shutter 20 is arranged in a way corresponding to the pattern periphery region St in the concave-convex patterned surface of the template 11. FIG. 3 is a plane view of the shutter 20 when viewed from above at a time when the substrate 14 is exposed to light through the template 11. As shown in FIG. 3, the shutter 20 is arranged in a region not corresponding to the pattern formed region Sp but to the pattern periphery region St. The shutter 20 includes shutter plates 20a each of which is provided at each of four side regions in the region corresponding to the pattern periphery region St of the template 11. Each of these side regions will be exposed to light two times through the patterning processes directed to the current shot and the adjacent shot. Furthermore, the shutter 20 includes shutter plates 20b each of which is provided at each of four corner regions in the region corresponding to the pattern periphery region St of the template 11. Each of these corner regions will be exposed to light four times through the patterning processes directed to the current shot and the adjacent shots. The shutter plates 20a and 20b are linked with the shutter moving unit 21, and independently movable. Each of the shutter plates 20a is movable in a direction deviating outward from the template 11 and in a direction opposite to that, as indicated by an arrow Y31. Meanwhile, each shutter plate 20b is movable in a direction deviating outward from the template 11 and in a direction opposite to that, as indicated by arrows Y32.

In the nano-imprint apparatus 1, ultraviolet exposing time for the region of the substrate 14 corresponding to the pattern periphery region St of the template 11 is adjusted by letting the respective shutter plates 20a and 20b move from the pattern periphery region St in the directions deviating outward from the template 11 as indicated by the arrows Y31 and Y32. Thereby, the exposure amount of ultraviolet light directed to the region of the substrate 14 corresponding to the pattern periphery region St of the template 11 can be adjusted. Specifically, by making the respective shutter plates 20a and 20b movable in the directions deviating outward from the template 11 from the pattern periphery region St, the exposing time with respect to the region of the substrate 14 corresponding to the pattern periphery region St of the template 11 will become shorter than the exposing time with respect to the region of the substrate 14 corresponding to the pattern formed region Sp of the template 11. Thereby, in one exposure of the substrate 14, the exposure amount at the region of the substrate 14 corresponding to the pattern periphery region St of the template 11 can be made less than the exposure amount at the region of the substrate 14 corresponding to the pattern formed region Sp of the template 11.

As a result, with respect to the organic material having been applied on the substrate 14, a hardening rate of the organic material as applied on the region that contacts the pattern periphery region St of the template 11 becomes lower than a hardening rate of the organic material as being hardened almost completely on the region that contacts the pattern formed region Sp of the template 11. Therefore, the organic material as applied on the region of the substrate 14 that contacts the pattern periphery region St of the template 11 is softer than the portion of the organic material as being hardened almost completely on the region of the substrate 14 that contacts the pattern formed region Sp of the template 11. By making the organic material which has been applied on the region of the substrate 14 that contacts the pattern periphery region St softer, the template 11 can be lowered down without being interfered even if the edges of the template 11 contact the organic material on the substrate 14. Thereby, the patterning process using the template 11 can be executed appropriately.

The organic material formed region that contacts the pattern periphery region St will be exposed to light several times through the patterning processes directed to the current shot and the adjacent shots. Here, in the nano-imprint apparatus 1, the total exposure amount at the regions of the substrate 14 corresponding to the pattern periphery region St of the template 11, by the time patterning was executed with respect to all the adjacent shots, has been set to be equal to the exposure amount at the regions on the surface of the substrate 14 corresponding to the pattern formed region Sp of the template 11, and to be nearly equal to the exposure amount that enables the organic material to harden completely. In other words, the total exposure amount at the regions of the substrate 14 corresponding to the pattern periphery region St of the template 11, by the time patterning was executed with respect to all the shots on the surface of the substrate 14, has been set to be equal to the exposure amount at the regions on the substrate 14 corresponding to the pattern formed region Sp of the template 11, and to be nearly equal to the exposure amount that enables the organic material to harden completely.

Figure 4:
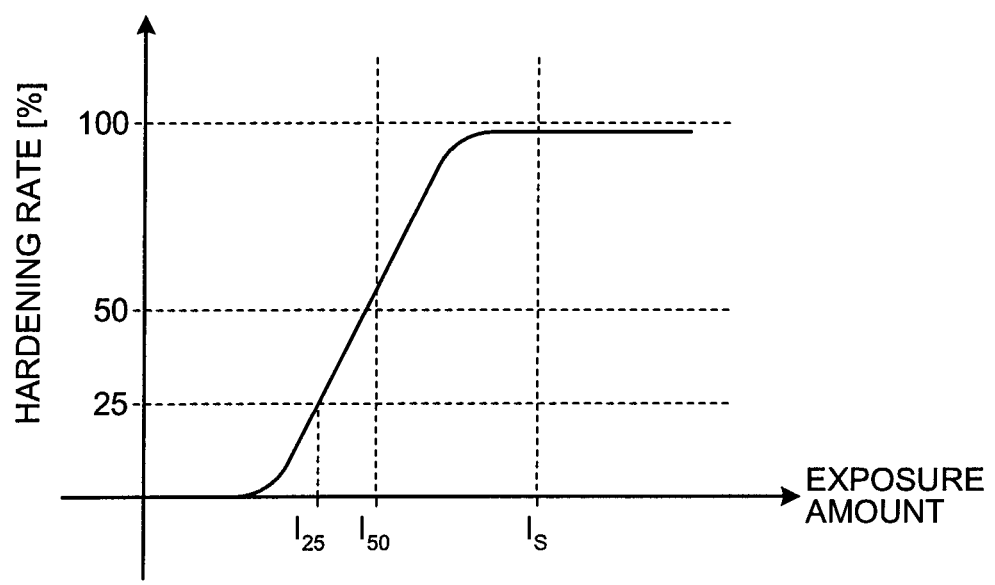
FIG. 4 is a diagram showing a relation between an exposure amount of ultraviolet light and a hardening rate of an organic material used in a nano-imprint technique.

With reference to FIG. 4, the exposure amount of ultraviolet light directed to each of the regions of the substrate 14 that contact the pattern periphery region St and the pattern formed region Sp of the template 11, respectively, among the regions on the substrate 14 where the organic material has been applied, will be described in specific terms. FIG. 4 is a diagram showing a relation between an exposure amount of ultraviolet light and a hardening rate of the organic material used in the nano-imprint technique. The exposure amount as shown in the diagram corresponds to a value derived by multiplying light intensity in exposure by exposing time.

As shown in FIG. 4, the hardening rate of the organic material applied on the substrate 14 becomes higher as the exposure amount of ultraviolet light increases. When the exposure amount of the organic material reaches Is, the organic material on the substrate 14 will become hardened almost completely. That is, with the exposure amount Is, the hardening rate will become approximately 100%. Meanwhile, the region on the substrate 14 that contacts the pattern formed region Sp of the template 11 will be hardened sufficiently in a single exposing process. Therefore, with respect to the region on the substrate 14 that contacts the pattern formed region Sp of the template 11, the exposing process will be executed with the exposure amount Is that renders the hardening rate approximately 100%.

On the other hand, the region on the substrate 14 that contacts the pattern periphery region St of the template 11 will be exposed to ultraviolet light from the light source 10 also through the patterning processes directed to the adjacent shots. That is, the organic material that contacts the pattern periphery region St of the template 11 will be exposed to light several times thorough the patterning processes directed to the current shot and the adjacent shots. Therefore, the organic material in the region of the substrate 14 that contacts the pattern periphery region St of the template 11 does not need to be hardened almost completely in a single exposing process, as long as it can be hardened almost completely by the time all the ultraviolet exposing processes on the respective adjacent shots are completed. Accordingly, with respect to the pattern periphery region St, the four regions, where the shutter plates 20a in FIG. 3 are provided and which are to be exposed to light two times through the patterning processes directed to the current shot and the adjacent shot, may desirably be exposed to ultraviolet light with the exposure amount Is that renders the hardening rate approximately 100% through the two ultraviolet exposing processes. Therefore, the exposure amount of ultraviolet light at each patterning process may be exposure amount $I_{50}$ that renders the hardening rate approximately 50%. In the nano-imprint apparatus 1, by adjusting the light shutting time during which the shutter plates 20a will shut out ultraviolet light, the exposure amount of ultraviolet light at each exposure with respect to the four regions which are to be exposed to light two times through the patterning processes directed to the current shot and the adjacent shot is adjusted to be exposure amount $I_{50}$.

With respect to the pattern periphery region St, the four regions, where the shutter plates 20b in FIG. 3 are provided and which are to be exposed to light four times through the patterning processes directed to the current shot and the adjacent shots, may desirably be exposed to ultraviolet light with the exposure amount that renders the hardening rate approximately 100% through the four ultraviolet exposing processes. Therefore, the exposure amount of ultraviolet light at each patterning process may be exposure amount $I_{25}$ that renders the hardening rate approximately 25%. In the nano-imprint apparatus 1, by adjusting the light shutting time during which the shutter plates 20b will shut out ultraviolet light, the exposure amount of ultraviolet light at each exposure with respect to the four regions which are to be exposed to light four times through the patterning processes directed to the current shot and the adjacent shots is adjusted to be exposure amount $I_{25}$.

In this way, in the nano-imprint apparatus 1, the movable shutter 20 is provided on the pattern periphery region St of the template 11, whereby the ultraviolet exposing time for each exposure with respect to the region of the substrate 14 corresponding to the pattern periphery region St of the template 11 is adjusted to render the exposure amount the exposure amount $I_{25}$ or the exposure amount $I_{50}$. Thus, in the nano-imprint apparatus 1, the organic material having been applied on the region of the substrate 14 that corresponds to the pattern periphery region St of the template 11 is brought to a soft state without becoming hardened almost completely. Thereby, the downward movement of the template 11 will not be interfered with the hardened organic material in the patterning processes directed to the adjacent shots. Moreover, in the nano-imprint apparatus 1, the organic material will be hardened to become almost completely solid by the time the patterning processes with respect to the entire shots are completed. Thereby, the subsequent etching process and so on will be able to be executed appropriately.

Now, patterning processes in the nano-imprint apparatus 1 will be described. FIG. 5-1 to FIG. 5-12 are schematic sectional views showing one example of procedures in the patterning processes executed by the nano-imprint apparatus 1 shown in FIG. 1.

Firstly, the substrate moving unit 16 moves the substrate 14, which is being supported by the substrate holder 15, such that a shot as being a pattern processing target on the substrate 14 will be placed underneath the coating unit 19. Then, by an ink-jet printing, the coating unit 19 applies organic material C on a shot region SA as being a processing target, as shown in FIG. 5-1.

Figures 1, 5:
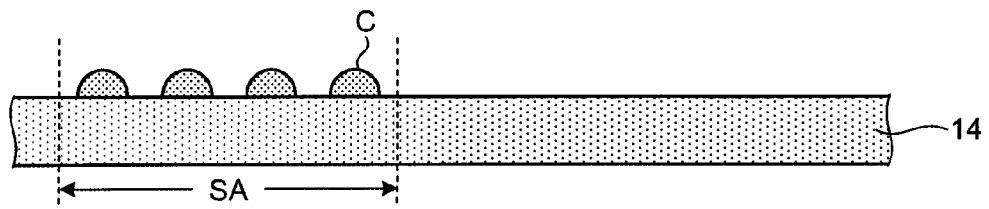
Figures 2, 5:
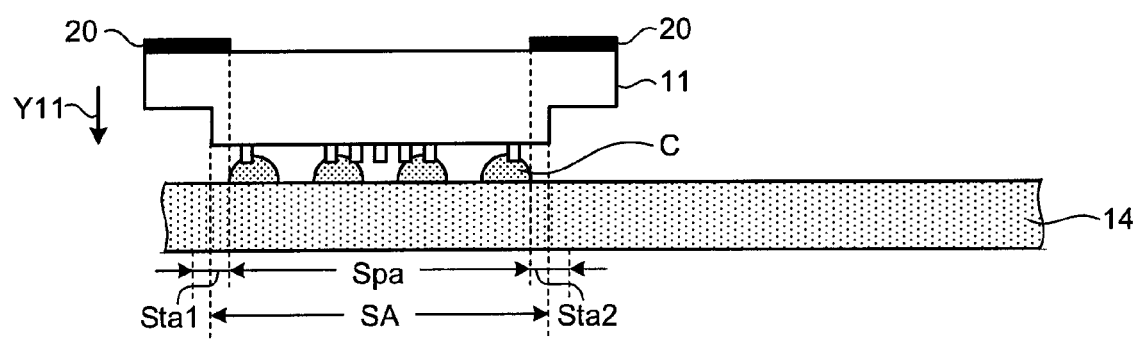
Figures 3, 5:
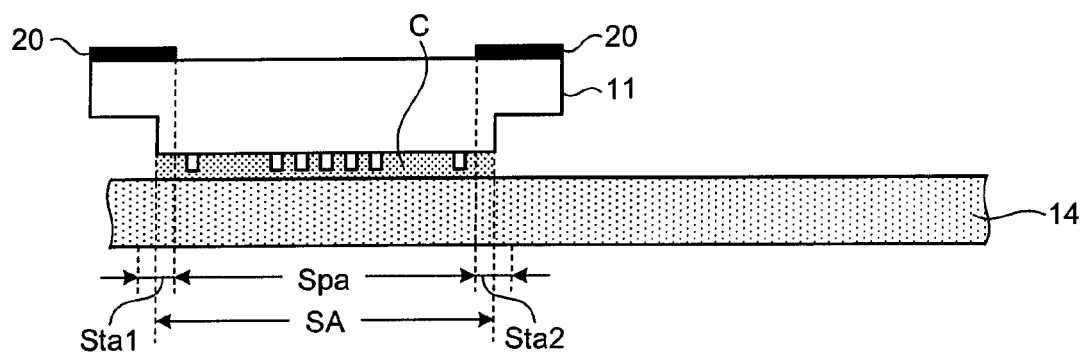
Figures 4, 5:
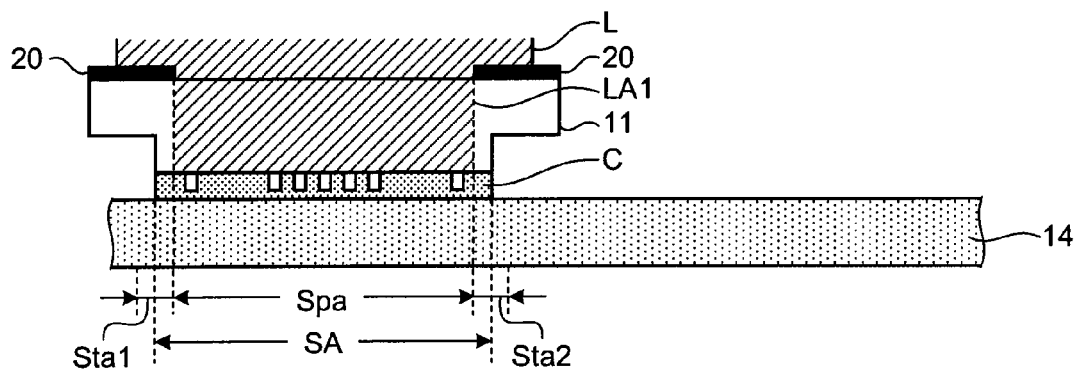
Figure 5:
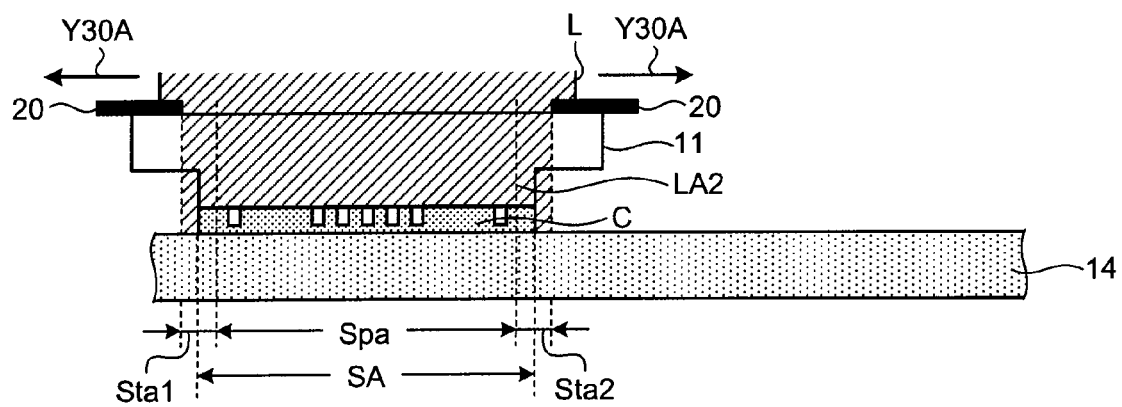

Then, as indicated by an arrow Y11 in FIG. 5-2, the elevation units 13 lower down the template 11 on the organic material C. At this time, the shutter 20 is being positioned on the pattern periphery region St of the template 11. In other words, the shutter 20 is being positioned above pattern periphery regions Sta1 and Sta2 in the shot region SA of the substrate 14. After that, as shown in FIG. 5-3, the template 11 is maintained at its lowered position for a predetermined fill-up waiting period so that the concave-convex pattern of the template 11 will be with the organic material C.

Then, in order to harden the organic material C on the substrate 14, the light source 10 (cf. FIG. 1) emits ultraviolet light on the organic material C. In this case, as shown in FIG. 5-4, since parts of ultraviolet light L having been emitted from the light source 10 toward the pattern periphery regions Sta1 and Sta2 will be shut out by the shutter 20, only the pattern forming region Spa will be exposed to a part of the ultraviolet light L as being ultraviolet light LA1.

Moreover, as mentioned earlier, with respect to the pattern periphery region St, the four regions, where the shutter plates 20a in FIG. 3 are provided and which are to be exposed to light two times through the patterning processes directed to the current shot and the adjacent shot, may desirably be exposed to ultraviolet light with the exposure amount Is that renders the hardening rate of the organic material approximately 100% through the two ultraviolet exposing processes. Therefore, with respect to the four regions which are to be exposed to light two times, the ultraviolet exposing time is being set such that the exposure amount of ultraviolet light at each patterning process will become the exposure amount $I_{50}$ that renders the hardening rate of the organic material approximately 50%. Accordingly, with respect to these regions, light-shielding process by the shutter plates 20a will be executed for a period of time that can be derived by subtracting exposing time $T_{50}$ corresponding to the exposure amount $I_{50}$ from exposing time Ts corresponding to the exposure amount Is that renders the hardening rate of the organic material on the pattern forming region Spa of the substrate 14 approximately 100%. Meanwhile, an exposure amount in the second exposure does not necessarily need to be adjusted. For instance, the first exposure can be executed with the exposure amount $I_{50}$ that renders the hardening rate approximately 50%, whereas the second exposure can be executed with the exposure amount Is that renders the hardening rate approximately 100%.

Figures 5, 6:
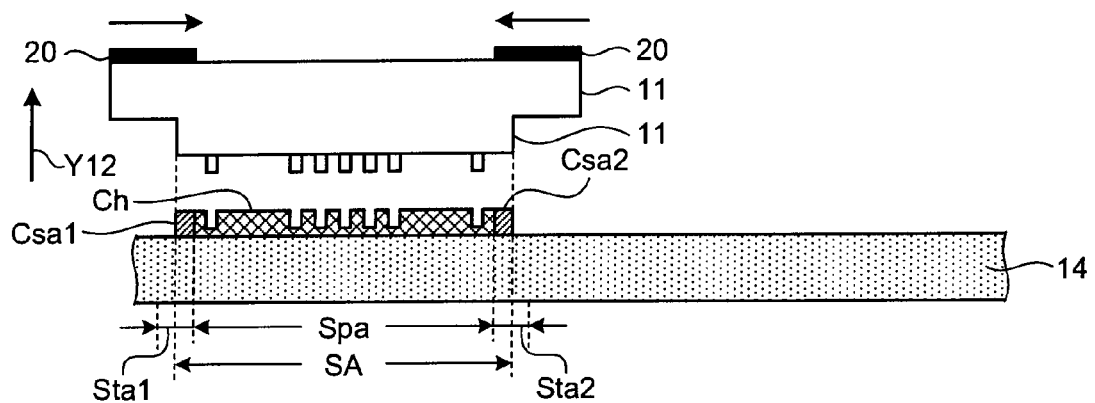

Furthermore, as mentioned earlier, with respect to the pattern periphery region St, the four regions, where the shutter plates 20b in FIG. 3 are provided and which are to be exposed to light four times through the patterning processes directed to the current shot and the adjacent shots, may desirably be exposed to ultraviolet light with the exposure amount Is that renders the hardening rate of the organic material approximately 100% through the four ultraviolet exposing processes. Therefore, with respect to the four regions which are to be exposed to light four times, the ultraviolet exposing time is being set such that the exposure amount of ultraviolet light at each patterning process will become the exposure amount $I_{25}$ that renders the hardening rate of the organic material approximately 25%. Accordingly, with respect to these regions, light-shielding process by the shutter plates 20b will be executed for a period of time that can be derived by subtracting exposing time T25 corresponding to the exposure amount $I_{25}$ from exposing time Ts corresponding to the exposure amount Is that renders the hardening rate of the organic material on the pattern forming region Spa of the substrate 14 approximately 100%. Meanwhile, an exposure amount in the fourth exposure does not necessarily need to be adjusted. For instance, first to third exposure can be executed with the exposure amount that renders the total hardening rate less than about 100%, whereas the fourth exposure can be executed with the exposure amount Is that renders the hardening rate approximately 100%. Then, after the described predetermined light shutting time has passed, the shutter 20 is moved outside the template 11 as indicated by arrows Y30A in FIG. 5-5. As a result, light interception by the shutter 20 the respect to the ultraviolet light L will be canceled, whereby the pattern periphery regions Sta1 and Sta2 of the substrate 14 will also be exposed to ultraviolet light LA2 along with the pattern forming region Spa. In this way, by moving the shutter 20 while the ultraviolet light L is being emitted, the exposure amount at the pattern periphery regions Sta1 and Sta2 of the substrate 14 is made less than the exposure amount at the pattern forming region Spa. Thereby, as shown in FIG. 5-6, a hardening rate of organic materials Csa1 and Csa2 on the pattern periphery regions Sta1 and Sta2 will become less than a hardening rate of an organic material Ch which has been hardened completely on the pattern forming region Spa, and thus the organic materials Csa1 and Csa2 will keep a soft state.

After the organic materials Csa1, Csa2 and Ch are hardened to come to predetermined hardening rates as described above, the light source 10 (cf. FIG. 1) stops emitting the ultraviolet light L. Then, as indicated by an arrow Y12 in FIG. 5-6, the elevation units 13 elevate the template 11 from above the organic materials Csa1, Csa2 and Ch, whereby the patterning process with respect to the shot region SA is completed. At the point of completion of the patterning process, the shutter 20 is being moved to be on the pattern periphery region of the template 11, for instance.

Figures 5, 6, 7:
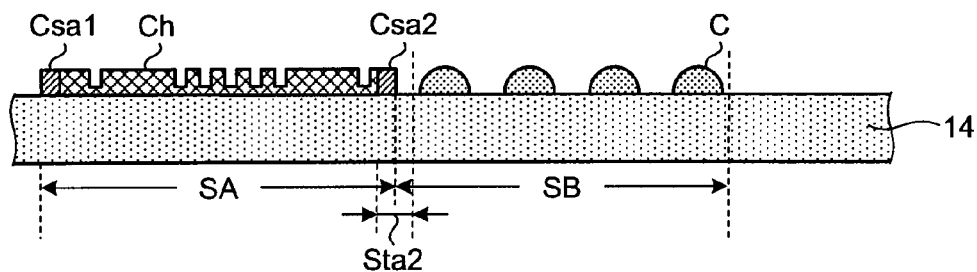

Next, in order to perform a patterning process on a shot region SB as being the next processing target, the substrate moving unit 16 moves the substrate 14 such that the shot region SB will be placed underneath the coating unit 19. Then, by an ink-jet printing, the coating unit 19 applies the organic material C on the shot region SB, as shown in FIG. 5-7.

Then, as indicated by an arrow Y13 in FIG. 5-8, the elevation units 13 lower down the template 11 on the organic material C of the shot region SB. After that, as shown in FIG. 5-9, the template 11 is maintained at its lowered position for a predetermined fill-up waiting period so that the concave-convex pattern of the template 11 will be filled with the organic material C. At this time, a pattern periphery region Stb1 between pattern periphery regions Stb1 and Stb2 in the shot region SB overlaps the pattern periphery region Sta2 in the adjacent shot region SA where the patterning process has already been completed. Since the organic material Csa2 having been formed on the pattern periphery region Stb1 is not being completely hardened but keeping a soft state, the template 11 can be lowered down without being interfered even if the edges of the template 11 contact the organic material Csa2 at the pattern periphery region Stb1. That is, the template 11 can be lowered down to a predetermined lowered position. Meanwhile, the shutter 20 is being positioned on the pattern periphery region St of the template 11. In other words, the shutter 20 is being positioned outside a pattern forming region Spb and above the pattern periphery regions Stb1 and Stb2 of the shot region SB.

Then, similarly to the process shown in FIG. 5-4, the light source 10 (cf. FIG. 1) emits ultraviolet light L as shown in FIG. 5-10. In this case, similarly to the case shown in FIG. 5-4, since parts of the ultraviolet light L having been emitted from the light source 10 toward the pattern periphery regions Stb1 and Stb2 will be shut out by the shutter 20, only the pattern forming region Spb will be exposed to a part of the ultraviolet light L as being ultraviolet light LB1.

Then, similarly to the process shown in FIG. 5-5, after the described predetermined light shutting time has passed, the shutter 20 is moved outside the template 11 as indicated by arrows Y30B in FIG. 5-11. As a result, light interception by the shutter 20 with respect to the ultraviolet light L will be canceled, whereby the pattern periphery regions Stb1 and Stb2 will also be exposed to ultraviolet light LB2 along with the pattern forming region Spb. At this point, due to the exposure with the ultraviolet light LB2, the organic material Csa2, having been formed on the pattern periphery region Stb1 as not being completely hardened but being kept in a partially-hardened state, becomes further hardened to eventually become almost completely solidified. Meanwhile, since the exposure amount at the pattern periphery region Stb2 is less than the exposure amount at the pattern forming region Stb2, an organic material Csb1 (cf. FIG. 5-12) on the pattern periphery region Stb2 is not being completely hardened but being kept in a soft state. After that, the light source 10 stops emitting the ultraviolet light L. Then, as indicated by an arrow Y14 in FIG. 5-12, the elevation units 13 elevate the template 11 from above the organic material Csb1, whereby the patterning process with respect to the shot region SB is completed. According to the present embodiment, the patterning process for each shot is executed through the respective processes described above.

In this way, in the nano-imprint apparatus 1 according to the present embodiment, the exposure amount with each exposure is adjusted between the organic material that contacts the pattern formed region Sp of the template 11 and the organic material that contacts the pattern periphery region St of the template 11. Thereby, according to the present embodiment, it is possible to let the organic material applied on the pattern periphery region Sta of the substrate 14 including the shot boundary not harden completely but be kept in a soft state. As a result, downward movement of the template 11 with respect to the adjacent shots will be able to be executed appropriately.

In the conventional case, in the patterning process for each shot, the organic material in every region of the shot is made to harden completely by being exposed to ultraviolet light with the exposure amount that renders the hardening rate of the organic material approximately 100%. However, In the conventional patterning process, even if the organic material is applied by an amount that corresponds to the shot area, there is a possibility that an organic material Ch0 passes over a boundary B0 of a shot region SA0 being a processing target and intrude into a region Rch in an unprocessed adjacent shot region SB0, as shown in FIG. 6. In such case, the intruding organic material could be hardened on the region Rch. Furthermore, as shown in a substrate sectional view of FIG. 7, there may be a case in that the organic material Ch0 having intruded into the region Rch in the unprocessed shot region SB0 might harden to a thickness Tch of which height is higher than a lowered position H0 of the template 11. In such case, when patterning on the shot region SB0 next to the shot region SA0 is executed by applying an organic material C0 on the shot region SB0, downward movement (in a direction indicated by an arrow Y15) of the template 11 might be interfered with the hardened organic material Ch0 within a region A1 having intruded into the region Rch. As a result, the template 110 might not be able to be lowered down to a predetermined template lowered position H0. Therefore, the organic material C0 as applied on the shot region SB0 being the processing target at that point might not be able to appropriately contact the template 110, whereby printing deficiency might occur in the shot region SB0.

Figures 5, 6, 7, 8:
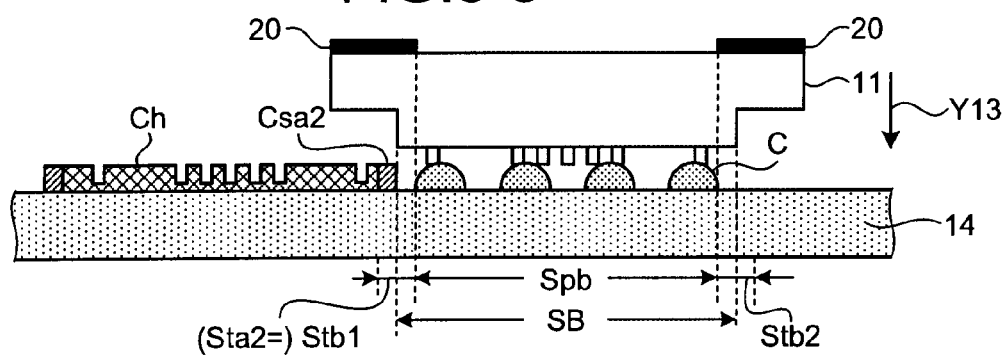
Figures 5, 6, 7, 8, 9:
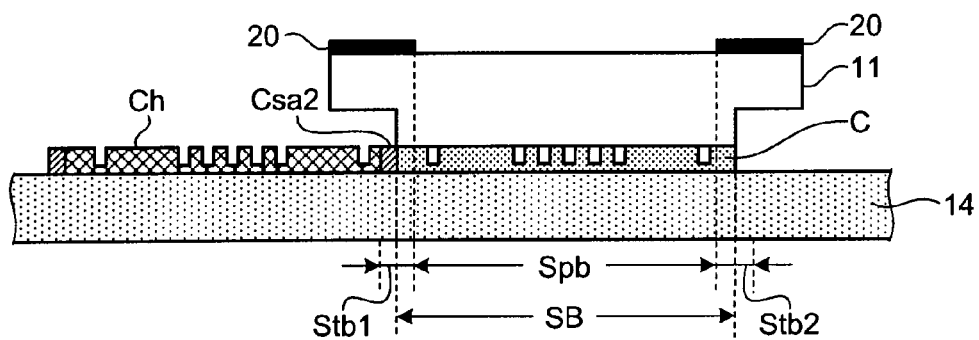
Figures 5, 6, 7, 8, 9, 10:
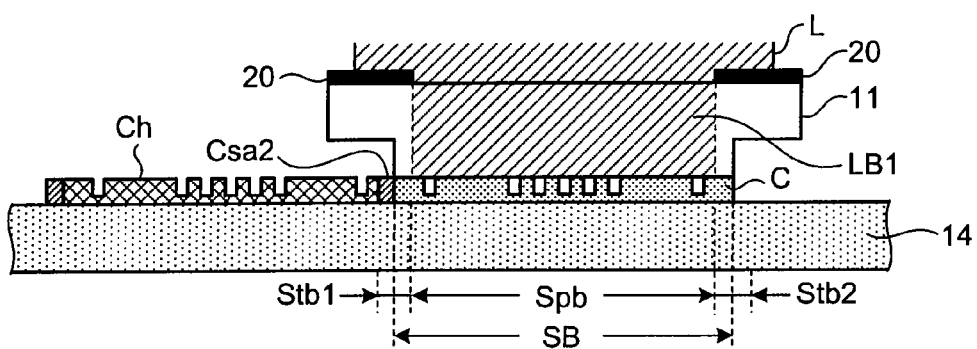

Therefore, in the conventional case, as shown in a substrate sectional view of FIG. 8, a gap R of several hundred micrometers is provided between the adjacent shot regions SA0 and SB0 in order to prevent the organic material Ch0 on the shot region SA0 from intruding into the adjacent shot region SB0. In this way, in the conventional case, gap regions, which are unnecessary in terms of the pattern forming, are arranged on the entire surface of the substrate. Therefore, in the conventional case, there is a problem in that a pattern forming surface (also referred to as sample surface) on the substrate cannot be used effectively, and that the number of shots which can be formed on the substrate is limited.

On the contrary, with the nano-imprint apparatus and the nano-imprint method according to the first embodiment as described above, the exposure amount of ultraviolet light directed to the region of the substrate 14 corresponding to the pattern periphery region Sta is made less than the exposure amount of ultraviolet light directed to the region of the substrate 14 corresponding to the pattern forming region Spa. Thereby, as shown in a substrate sectional view of FIG. 9, the organic material Cs having been applied on the pattern periphery region Stb that includes a boundary B between the shot region SA where the patterning process has already been completed and the shot region SB as being the next target of the patterning process is not completely hardened but kept in a soft state. Therefore, even in a case where the organic material Cs, having been formed to a height higher than a lowered position H of the template 11, intrudes into the unprocessed shot region SB, it is possible to let the organic material Cs contacting the edges of the template 11 be deformed in a way shown by an arrow Y40 in FIG. 9. As a result, the template 11 can be lowered down appropriately to the template lowered position H. In this way, in the nano-imprint apparatus 1 according to the present embodiment, even in a case where the organic material Cs intrudes into the unprocessed shot region SB from the shot region SA where the patterning process has already been completed, it is possible to let the template 11 and the organic material C as applied on the shot region SB being the processing target contact each other to a sufficient extent. Therefore, printing deficiency will not occur. Thereby, according to the first embodiment, it is possible to let the template 11 and the organic material C contract each other to a sufficient extent without having to arrange any gap, as arranged in the above-described conventional case, between the shot region SA and the shot region SB. Thus, it is possible to enlarge the effective area on the pattern forming surface of the substrate 14. As a result, more shots can be formed on the substrate 14 than in the conventional case.

In the first embodiment, although the case in which the nano-imprint apparatus 1 has a structure in that the shutter 20 and the shutter moving unit 21 are provided directly on the template 11 and the template holders 12 have been described by way of example, the nano-imprint apparatus is not limited to such structure. For example, the shutter 20 and the shutter moving unit 21 can be arranged differently as long as they can shut out the ultraviolet light directed to the region of the substrate 14 corresponding to the pattern periphery region Sta for a predetermined period of time. Accordingly, the shutter 20 and the shutter moving unit 21 can work effectively enough as long as they are placed somewhere in the light path between the light source 10 and the template 11. From this perspective, as in a case of a nano-imprint machine 2a shown in FIG. 10, the shutter 20 and the shutter moving unit 21 can be arranged separately above the template 11 and the template holders 12.

Figures 5, 6, 7, 8, 9, 10, 11:
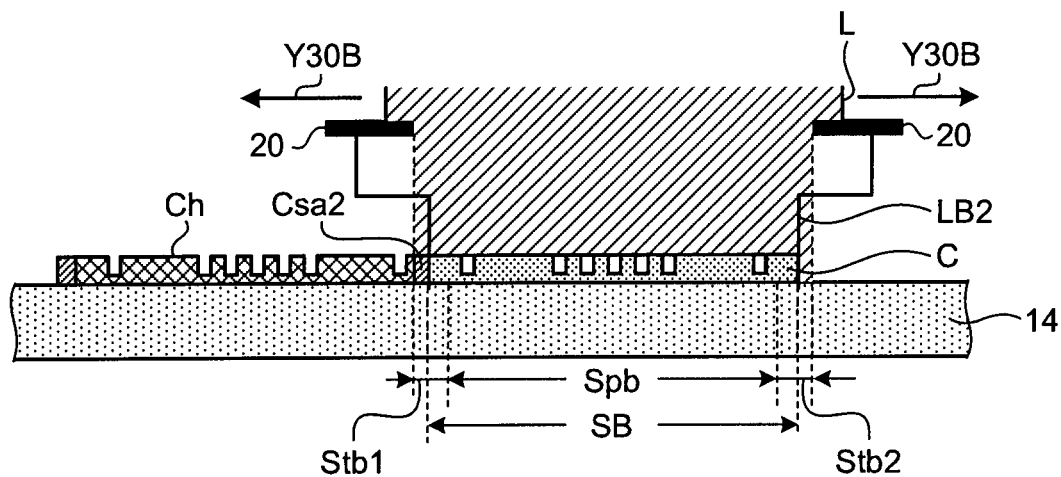

Moreover, in the first embodiment, although the case in which the shutter 20 is arranged as corresponding to the entire pattern periphery region St has been described by way of example, the shutter 20 does not necessarily need to be arranged that way. That is, the shutter 20 and the shutter moving unit 21 can be arranged differently as long as possible interference with downward movement of the template 11 in the patterning process with respect to the shot to be processed after the patterning process with respect to the shot currently being the processing target can be prevented. Therefore, the shutter 20 and the shutter moving unit 21 can work effectively enough as long as they can let at least the organic material that is in the pattern periphery region Sta and is next to the pattern printing region where the patterning process has not been executed not harden completely. One such example will be described with reference to FIG. 11-1 and FIG. 11-2. FIG. 11-1 and FIG. 11-2 are diagrams for illustrating a patterning process with respect to a shot region SA in a case of performing patterning processes with respect to shot region SC, shot region SA, and shot region SB, in that order.

As shown in FIG. 11-1, the shutter 20 is provided on the template 11 only on the side of the shot region SB where the patterning process has not been performed. That is, the shutter 20 is not provided on the side of the shot region SC where the patterning process has already been completed. Therefore, as shown in FIG. 11-1, in the ultraviolet exposing process with respect to the shot region SA, by being exposed to ultraviolet light LA1 with the exposure amount that renders the hardening rate approximately 100%, the organic material C on the pattern periphery region Sta1 on the side of the shot region SC where the patterning process has already been completed will harden almost completely along with the organic material C on the pattern forming region Spa in the shot region SA. Meanwhile, the organic material C on the pattern periphery region Sta2 on the side of the shot region SB will be kept unhardened since the ultraviolet light directed thereto is being shut out by the shutter 20. On the other hand, with respect to the shot region SB, as shown in FIG. 11-2, the template 11 when being lowered down might contact the organic material C on the pattern periphery region Stb1 (substantially the same as the pattern periphery region Sta2) on the side of the shot region SA where the patterning process has already been completed, but the organic material C on the pattern periphery region Stb1 at that point will still be at a soft state. Therefore, the template 11 will be able to be lowered down on the shot region SB without being interfered. Then, by being exposed to ultraviolet light LB1 with the exposure amount that renders the hardening rate approximately 100%, the organic material C at the pattern periphery region Stb1 will harden almost completely along with the organic material C on the pattern forming region Spb in the shot region SB, since the organic material C on the pattern periphery region Stb1 at this point is not shielded from the ultraviolet light by the shutter 20.

In this way, what is expected from the imprint method according to the present embodiment is that the imprint method includes a hardening process in multiple stages through which, in a case where patterning is executed sequentially with respect to a predetermined shot of a light curable material and a shot adjacent thereto, the light curable material applied on a region of the predetermined shot that at least contacts a part of a pattern periphery region of a template is rendered a partially-hardened state by exposure at the time of patterning of the predetermined shot whereas that light curable material will then be further hardened through exposure at the time of patterning of the adjacent shot. For example, eventually, by the time the patterning processes with respect to the entire shots on the substrate 14 are finished, the total exposure amount of ultraviolet light directed to the regions of the substrate 14 corresponding to the pattern periphery region of the template 11 may desirably be the exposure amount of ultraviolet light directed to the regions on the surface of the substrate 14 corresponding to the pattern formed region of the template 11, that is, the exposure amount equivalent to that enabling the hardening rate to become approximately 100%. Thus, as described above, it is possible not only to prevent downward movement of the template 11 from being interfered but also to execute the subsequent etching process appropriately. Therefore, it is possible to eliminate the necessity to have the shutter 20 arranged in a way corresponding to the entire pattern periphery region St. In the cases of FIG. 11-1 and FIG. 11-2, in the shot regions at the edge parts of the substrate 14, the pattern periphery regions on the edge side of the substrate 14 will not be exposed to light multiple times. Therefore, in the case when the shutter 20 is positioned at such pattern periphery region, the organic material at the edge part of the shot, in order to be completely hardened, may desirably be exposed to ultraviolet light while the shutter 20 is moved outside the shot.

Second Embodiment

A second embodiment of the present invention will be described. In the second embodiment, for example, a transmissive film with a predetermined transmittance is arranged between the substrate and the light source, for the purpose of adjusting light intensity in exposure with respect to the region on the surface of the substrate corresponding to the pattern periphery region.

Figures 5, 6, 7, 8, 9, 10, 11, 12:
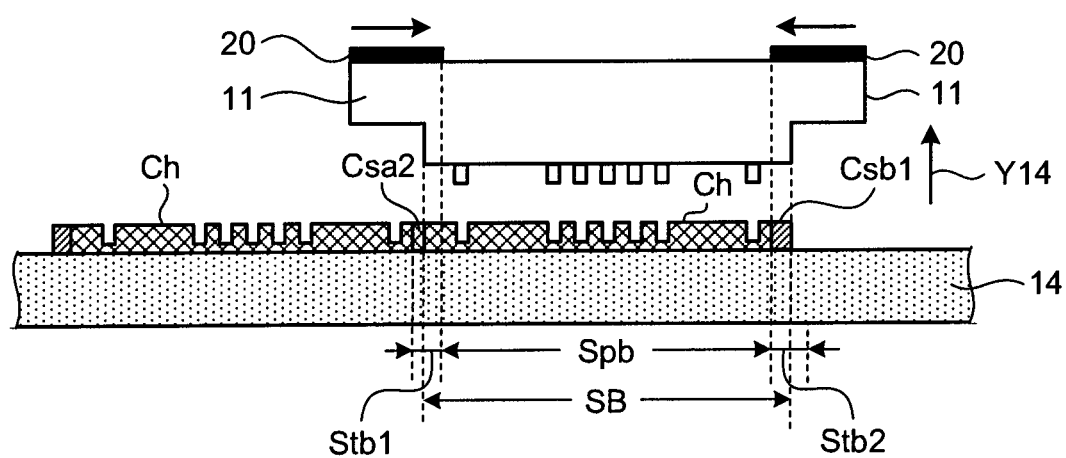
Figure 6:
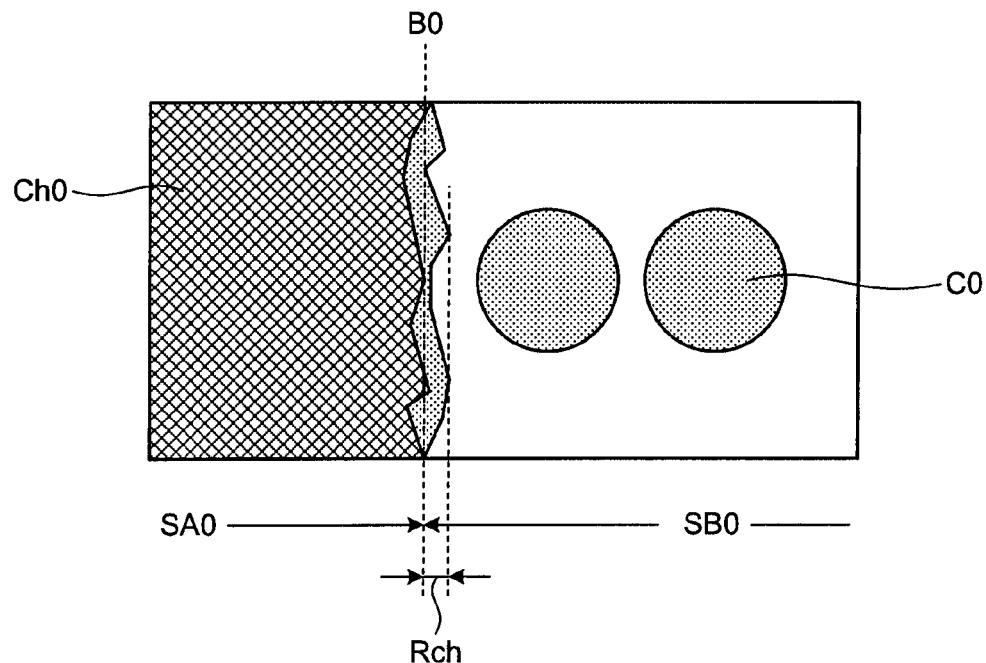
Figure 7:
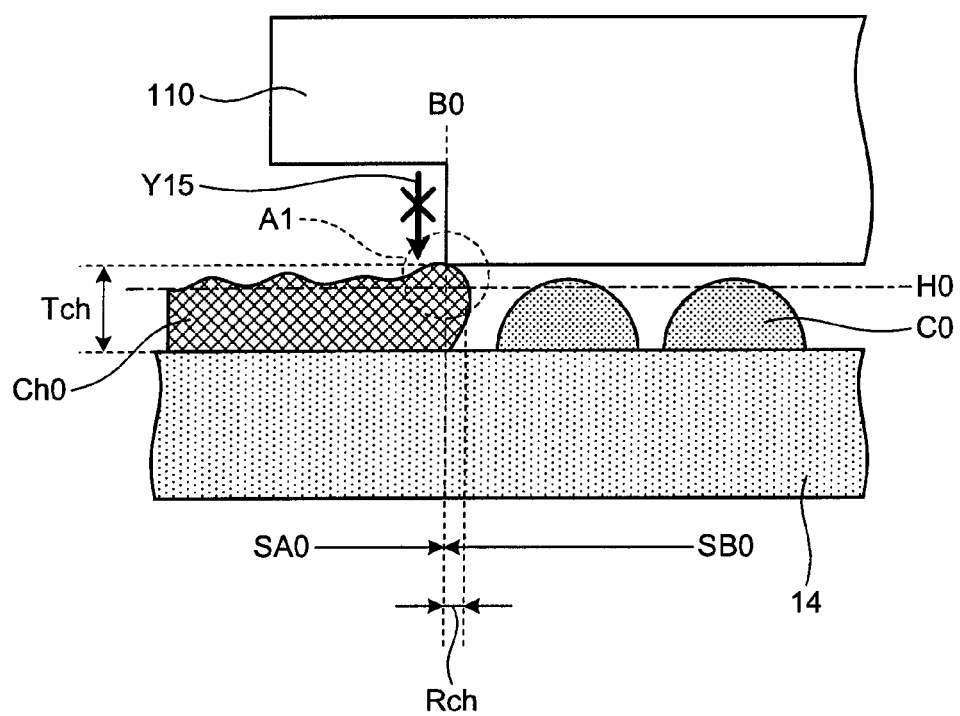
Figure 8:
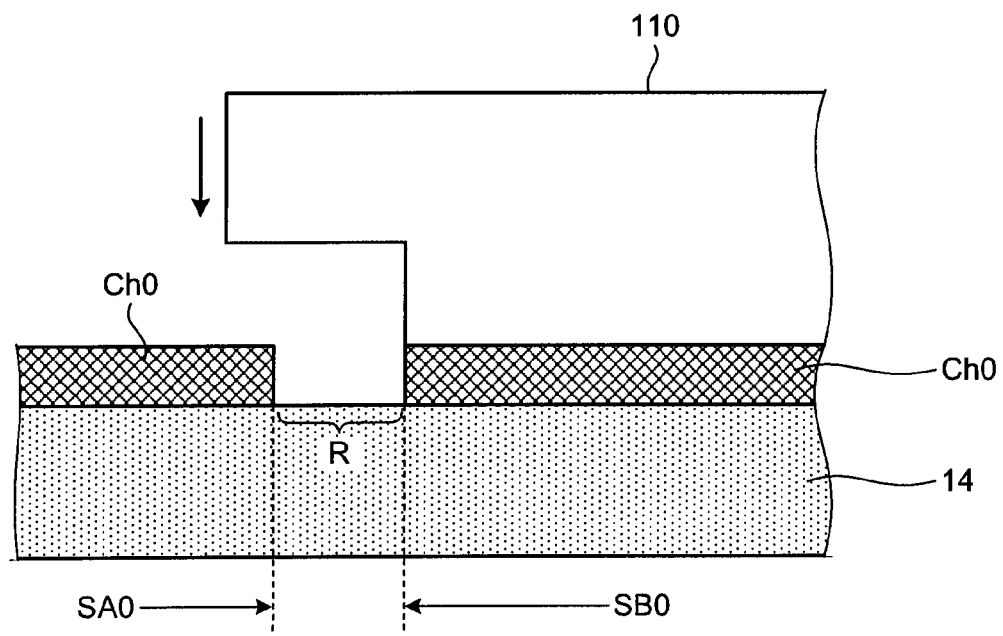
Figure 9:
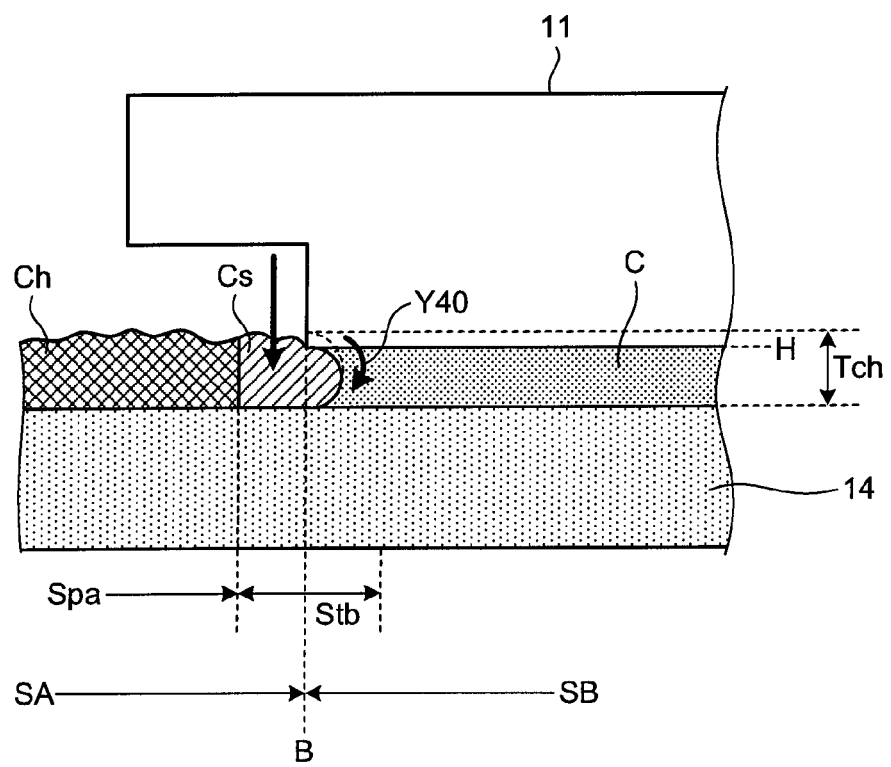
Figure 10:
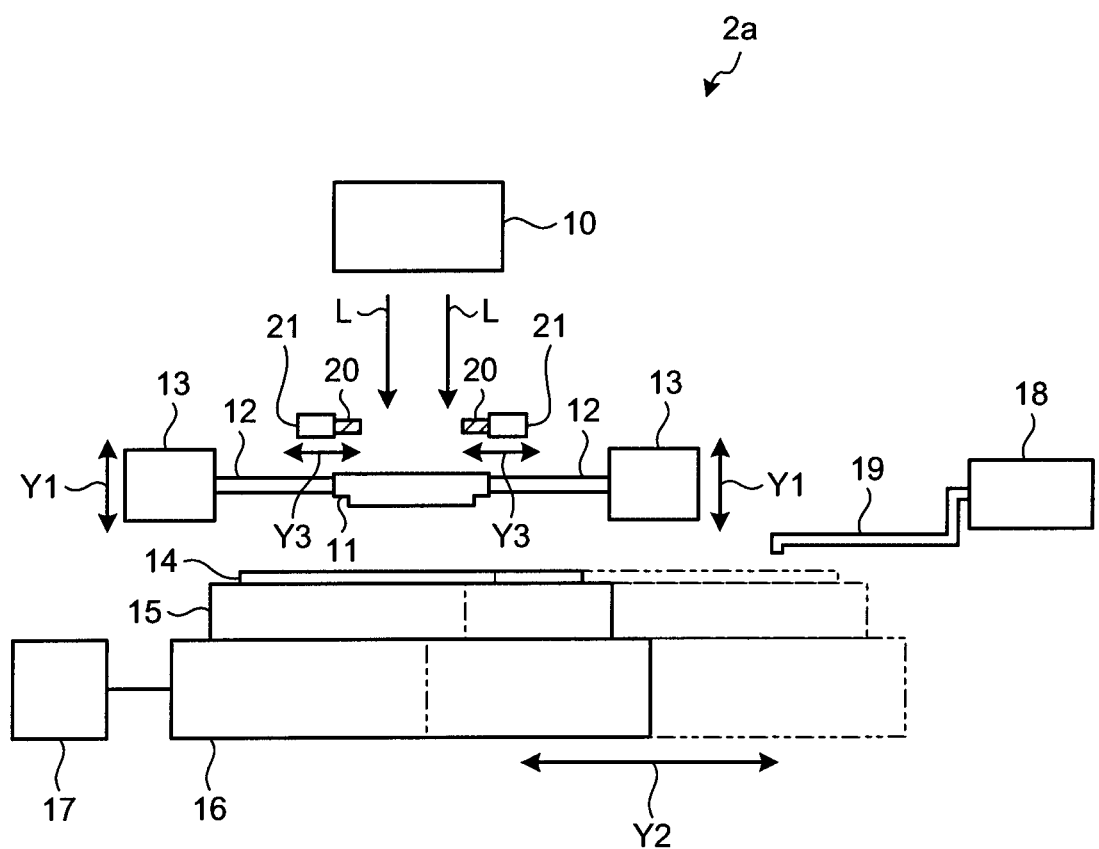
Figures 1, 11:
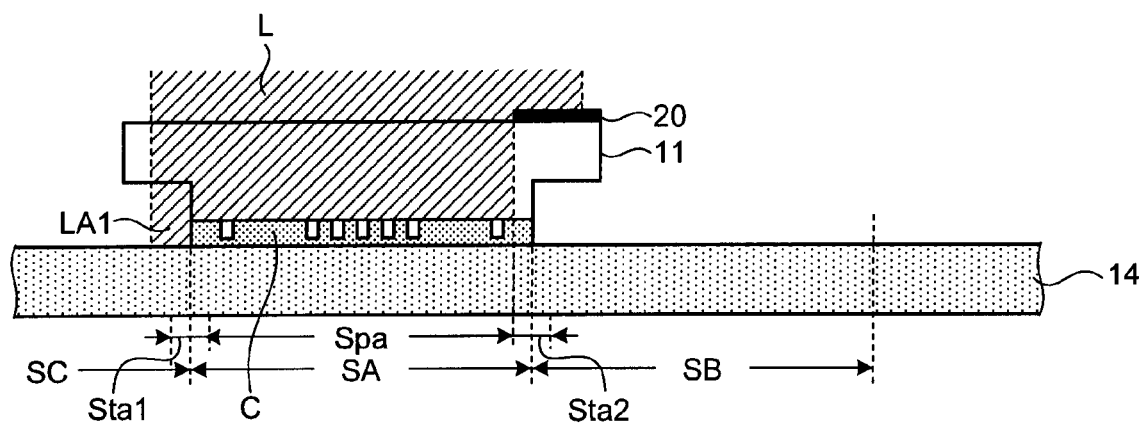
Figures 2, 11:
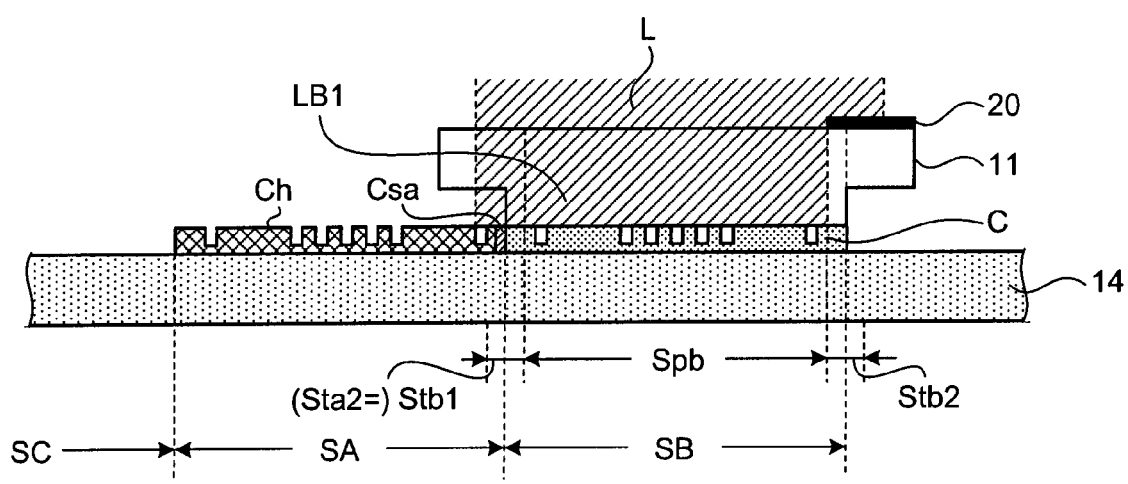
Figure 12:
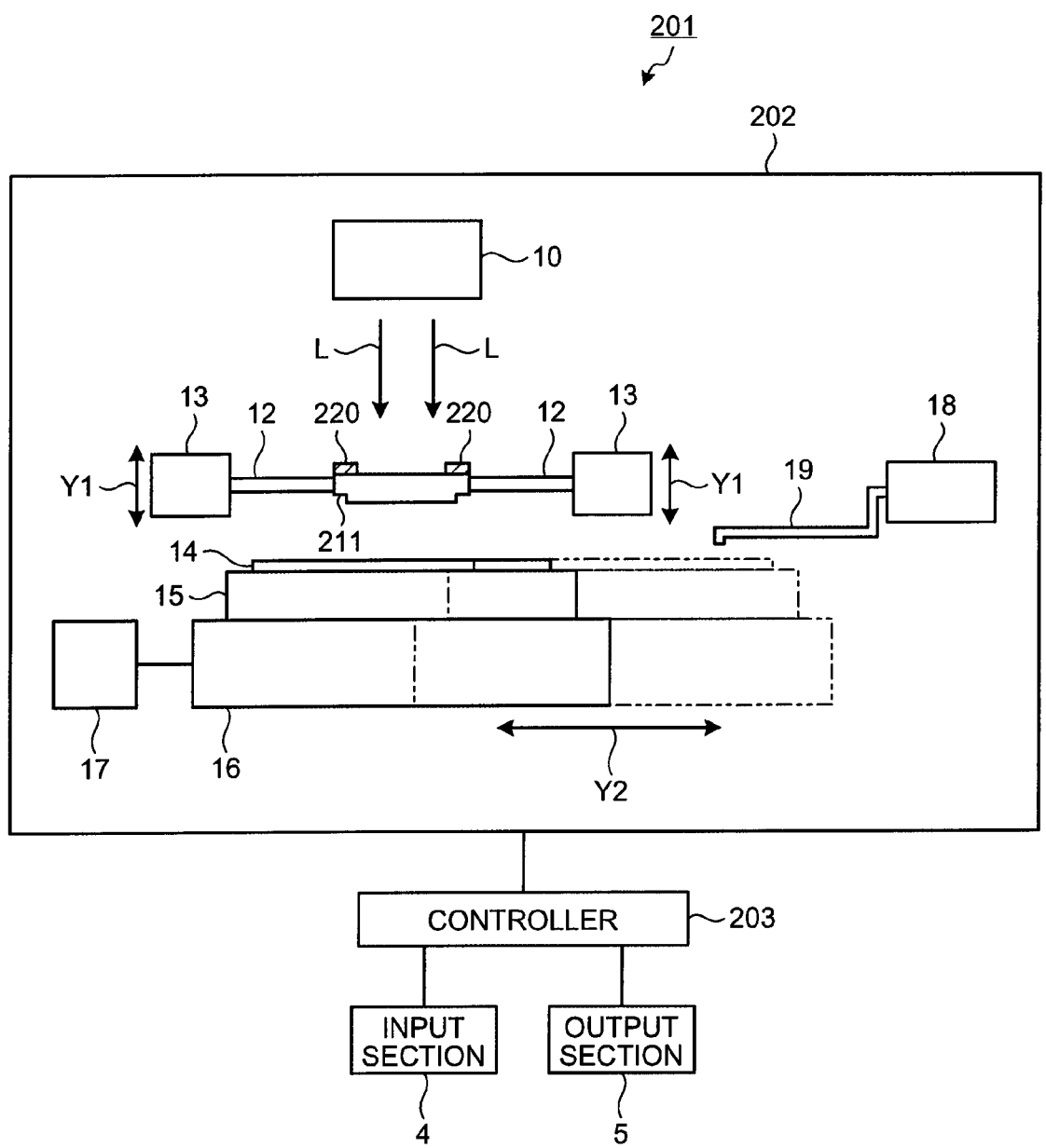
Figure 13:
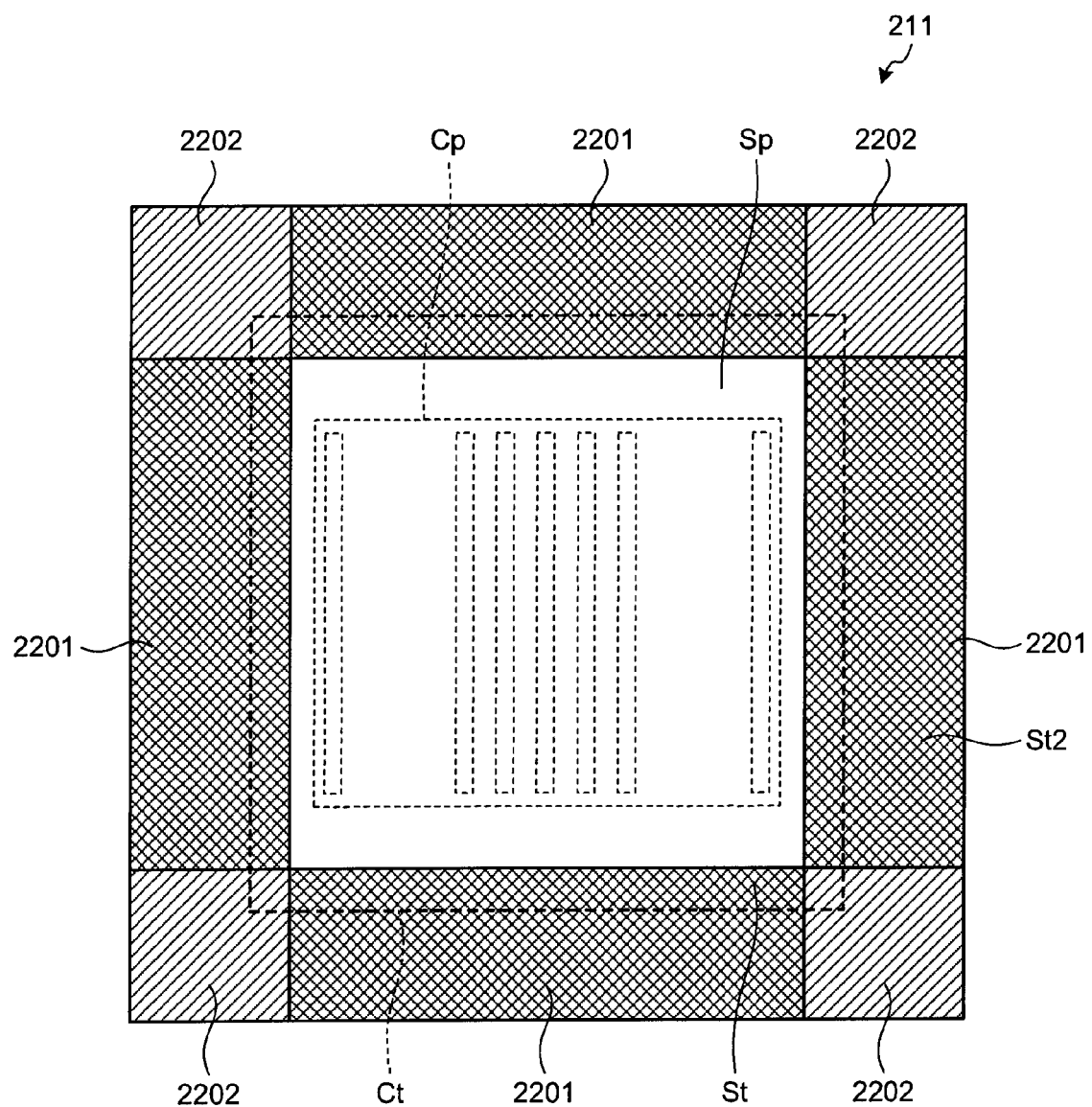
FIG. 13 is a plane view of a template shown in FIG. 12 when viewed from above.

FIG. 12 is a schematic diagram showing one example of a structure of a nano-imprint apparatus according to the second embodiment. As shown in FIG. 12, a nano-imprint apparatus 201 according to the second embodiment has a nano-imprint machine 202 which does not have the shutter (corresponding to the shutter 20 shown in FIG. 1) or the shutter moving units (corresponding to the shutter moving unit 21 shown in FIG. 1). Meanwhile, instead of the template 11 as shown in FIG. 1, the nano-imprint machine 202 has a template 211 where a transmissive film 220 with a predetermined transmittance is arranged. Moreover, instead of the controller 3 as shown in FIG. 1, the nano-imprint apparatus 201 has a controller 203 that controls each of the constructing parts of the nano-imprint apparatus 201. Since the rest of the structure is similar to that of the nano-imprint apparatus 1 shown in FIG. 1, detailed description of such structure will be omitted herein. Furthermore, the nano-imprint apparatus 201 according to the second embodiment or the nano-imprint apparatus 1 according to the first embodiment can be rendered a kind of a nano-imprint apparatus which can use the template 11 (i.e. template for exposing time adjustment) as shown in FIG. 2 and the template 211 (i.e. template for light intensity adjustment) as shown in FIG. 13 in combination. Since a structure or an operation with respect to such kind of nano-imprint apparatus is easily conceivable based on the above and the following descriptions, detailed description thereof will be omitted herein.

Now, the template 211 shown in FIG. 13 will be described. FIG. 13 is a plane view of the template 211 when viewed from above. As shown in FIG. 13, the template 211 is provided with transmissive films 2201 and 2202, having predetermined transmittances, which are arranged on the pattern periphery region St2 being a region outside the pattern formed region Sp that includes the patterned region Cp. A region on the surface of the substrate 14 which comes underneath the pattern periphery region St2 of the template 211 at the time of pattern printing will be exposed to light from the light source 10 also in the patterning processes directed to the adjacent shots.

The transmissive film 2201 is provided at each of four side regions in the region corresponding to the pattern periphery region St2 of the template 211. Each of these side regions will be exposed to light two times through the patterning processes directed to the current shot and the adjacent shot. The transmissive film 2202 is provided at each of four corner regions in the region corresponding to the pattern periphery region St2 of the template 211. Each of these side regions will be exposed to light four times through the patterning processes directed to the current shot and the adjacent shots.

In this nano-imprint apparatus 201, the light intensity in exposure with respect to the region of the pattern forming surface of the substrate 14 that comes underneath the pattern periphery region St2 of the template 211 is adjusted by the template 211. Thereby, with respect to the exposure amount at the substrate 14 in one exposure, the exposure amount at the region of the substrate 14 that comes underneath the pattern periphery region St2 of the template 211 is adjusted to become less than the exposure amount at the region of the substrate that comes underneath the pattern formed region Sp of the template 211. Accordingly, with respect to the organic material having been applied on the pattern forming surface of the substrate 14, the hardening rate of the organic material applied on the region that comes underneath the pattern periphery region St2 of the template 211 is rendered less than the hardening rate of the organic material positioned underneath the pattern formed region Sp of the template 211 as being hardened almost completely.

In the nano-imprint apparatus 201, as in the case of the nano-imprint apparatus 1 according to the first embodiment, the total exposure amount of ultraviolet light directed to the regions of the substrate 14 that come underneath the pattern periphery region St2 of the template 211, by the time patterning was executed with respect to all the shots on the pattern forming surface of the substrate 14, has been set to be equal to the exposure amount of ultraviolet light directed to the regions of the substrate 14 that come underneath the pattern formed region Sp of the template 211, and to be nearly equal to the exposure amount that enables the organic material to harden completely.

For example, with respect to the pattern periphery region St2, the four regions, where the transmissive films 2201 in FIG. 13 are provided and which are to be exposed to light two times through the patterning processes directed to the current shot and the adjacent shot, may desirably be exposed to ultraviolet light with the exposure amount Is that renders the hardening rate approximately 100% through the two ultraviolet exposing processes. Therefore, the exposure amount of ultraviolet light at each patterning process may be appropriate with exposure amount $I_{50}$ that renders the hardening rate of the organic material approximately 50%. The exposure amount is a value that can be derived by multiplying the light intensity in exposure by the exposing time. The pattern periphery region St2 will be exposed to ultraviolet light for the same period of time as the pattern formed region Sp. Therefore, the transmissive films 2201 may desirably have a transmittance that allows the total amount of light transmitted through the transmissive films 2201 during the ultraviolet exposing time to become exposure amount $I_{50}$. Moreover, with respect to the pattern periphery region St2, the four regions, where the transmissive films 2202 in FIG. 13 are provided and which are to be exposed to light four times through the patterning processes directed to the current shot and the adjacent shots, may desirably be exposed to ultraviolet light with the exposure amount Is that renders the hardening rate approximately 100% through the four ultraviolet exposing processes. Therefore, the exposure amount of ultraviolet light at each patterning process may be appropriate with exposure amount $I_{25}$ that renders the hardening rate of the organic material approximately 25%. Therefore, the transmissive films 2202 may desirably have a transmittance that allows the total amount of light transmitted through the transmissive films 2202 during the ultraviolet exposing time to become exposure amount $I_{25}$.

In this way, by using the template 211 provided with the transmissive film 220, it is possible to make the amount of transmitted light at the pattern periphery region St2 of the template 211 less than the amount of transmitted light at the pattern formed region Sp of the template 211 that includes the concave-convex pattern.

Thus, in the nano-imprint apparatus 201, by using the template 211 provided with the transmissive film 220 with a predetermined transmittance as arranged in a way corresponding to the pattern periphery region St2, the light intensity in exposure with respect to the region of the substrate 14 that comes underneath the pattern periphery region St2 of the template 211 is rendered less than the light intensity in exposure with respect to the region of the substrate 14 that comes underneath the pattern formed region Sp of the template 211. Accordingly, the exposure amount at the region of the substrate 14 that comes underneath the pattern periphery region St2 of the template 211 in one exposure is rendered less than the exposure amount at the region of the substrate 14 that comes underneath the pattern formed region Sp of the template 211. Thereby, the organic material having been applied on the substrate region under the pattern periphery region St2 of the template 211 can be kept in a soft state without being completely hardened, and thus, the organic material being kept in a soft state will not interfere with downward movement of the template 211 in the patterning processes with respect to the adjacent shots. Moreover, in the nano-imprint apparatus 201, the organic material will be hardened to become almost completely solid by the time the patterning processes with respect to the entire shots are completed. Thereby, the subsequent etching process and so on will be able to be executed appropriately.

Figures 1, 14:
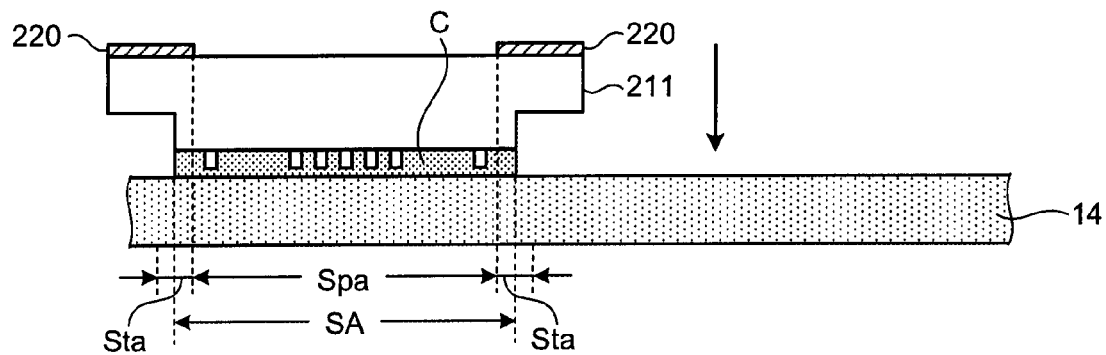
Figures 2, 14:
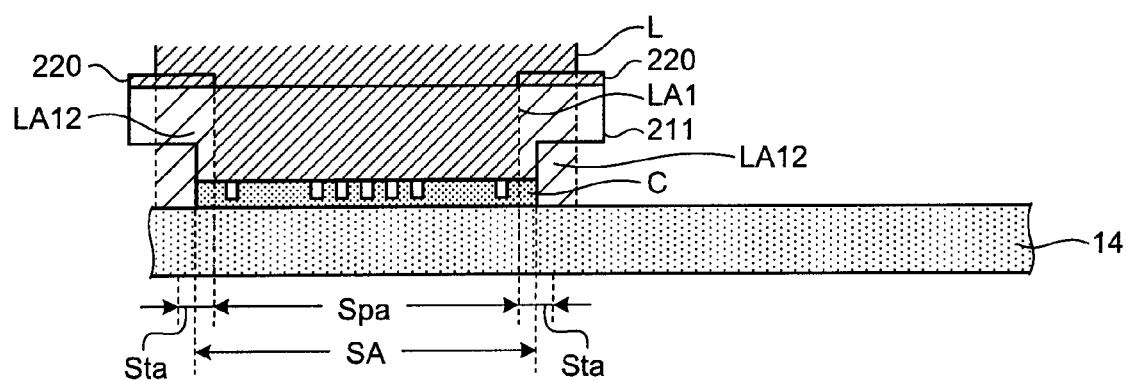
Figures 3, 14:
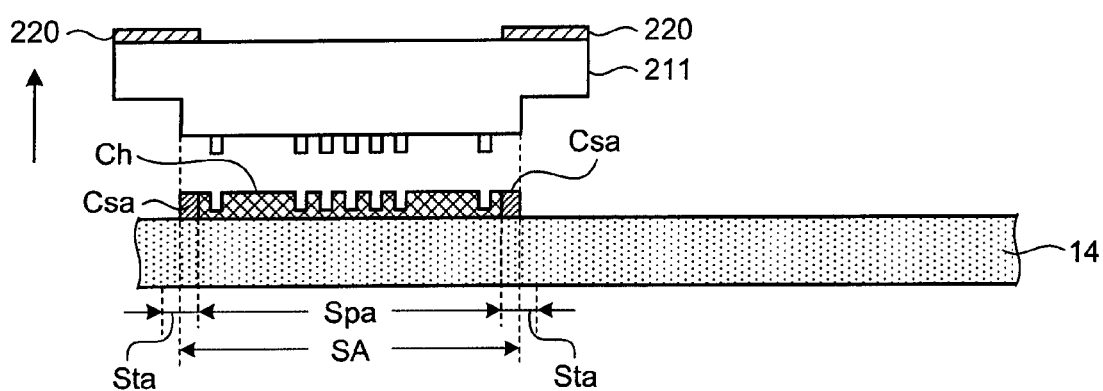
Figures 4, 14:
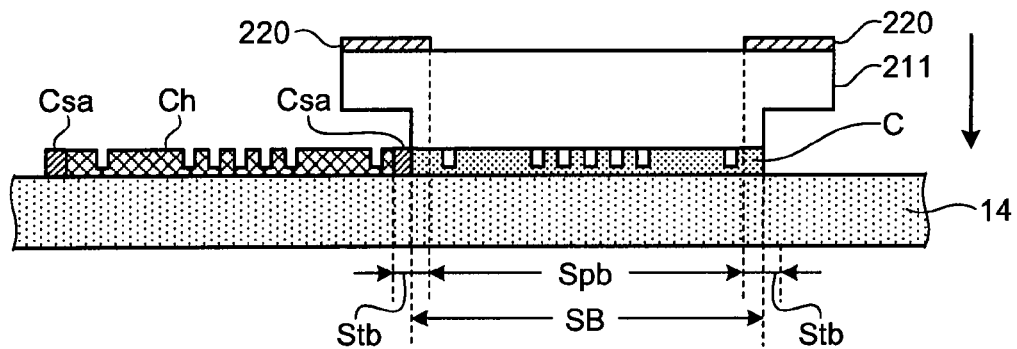
Figures 5, 14:
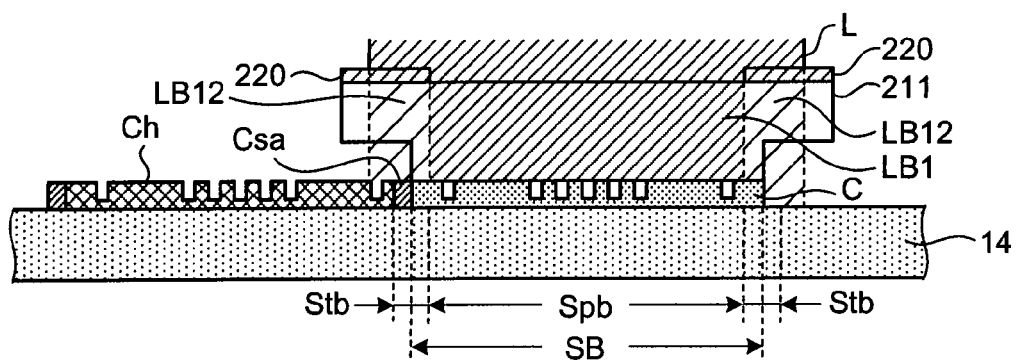
Figures 6, 14:
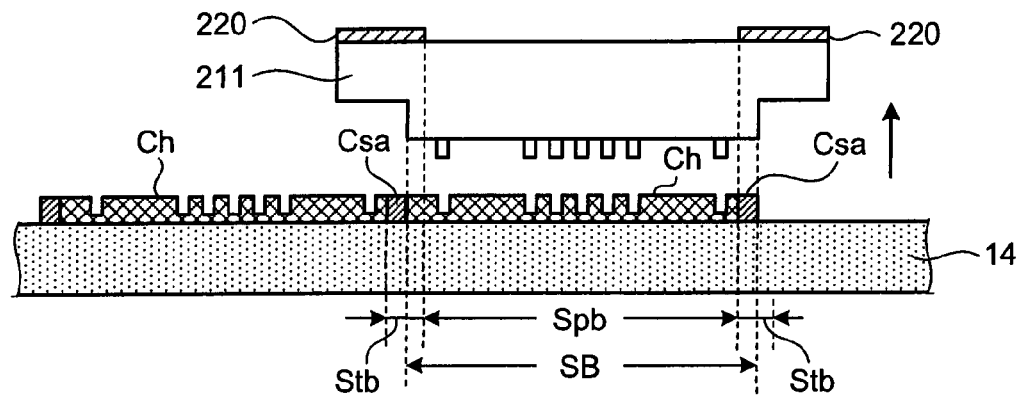

Now, patterning processes in the nano-imprint apparatus 201 will be described. FIG. 14-1 to FIG. 14-6 are schematic sectional views showing one example of procedures in the patterning processes executed by the nano-imprint apparatus 201 shown in FIG. 12.

Firstly, through a process similar to the process shown in FIG. 5-1, the organic material C is applied to a shot as being a processing target by an ink-jet printing. Then, as indicated by an arrow in FIG. 14-1, the elevation units 13 lower down the template 211 on the organic material C in the shot region SA being the processing target. After that, the template 211 is maintained at its lowered position for a predetermined fill-up waiting period so that the concave-convex pattern of the template 211 will be filled with the organic material C. At this time, the transmissive film 220 is being positioned above the pattern periphery region Sta in the shot region SA.

Then, in order to harden the organic material C on the substrate 14, the light source 10 (cf. FIG. 12) emits ultraviolet light on the organic material C. In this case, as shown in FIG. 14-2, the pattern forming region Spa of the substrate 14 will be exposed to ultraviolet light LA1 with the exposure amount that renders the hardening rate of the organic material C approximately 100%. Meanwhile, the pattern periphery region Sta of the substrate 14 will be exposed to ultraviolet light LA12 which is a part of ultraviolet light L being transmitted through the transmissive film 220 and of which exposure amount is being the exposure amount $I_{50}$ or the exposure amount $I_{25}$ that renders the hardening rate of the organic material approximately 50% or 25%. As a result, the organic material Csa on the pattern periphery region Sta will have a hardening rate less than the organic material Ch on the pattern forming region Spa, and thus will be kept in a soft state.

Then, after the organic materials Csa and Ch are hardened to come to predetermined hardening rates, respectively, the light source 10 (cf. FIG. 12) stops emitting the ultraviolet light L. Then, as indicated by an arrow in FIG. 14-3, the elevation units 13 elevate the template 211 from above the organic materials Csa and Ch, whereby the patterning process with respect to the shot region SA is completed.

Next, in order to perform a patterning process on the shot region SB as being the next processing target, the organic material C is applied to the shot region SB by an ink-jet printing through a process similar to the process shown in FIG. 5-7. Then, as indicated by an arrow in FIG. 14-4, the elevation units 13 lower down the template 211 on the organic material C on the shot region SB. After that, the template 211 is maintained at its lowered position for a predetermined fill-up waiting period so that the concave-convex pattern of the template 211 will be filled with the organic material C. At this point, with respect to the pattern periphery region Stb in the shot region SB, the organic material Csa having already been formed on the part of the pattern periphery region Stb (substantially the same as the pattern periphery region Sta in the shot region SA on the side of the shot region SB) on the side of the shot region SA is not being completely hardened but being kept in a soft state. Therefore, the template 211 can be lowered down without being interfered even if the edges of the template 211 contact the organic material Csa on the pattern periphery region Stb. That is, the template 211 can be lowered down to a predetermined lowered position.

Then, as shown in FIG. 14-5, the light source 10 (cf. FIG. 12) emits ultraviolet light L. In this case, similarly to the case shown in FIG. 14-2, the pattern forming region Spa will be exposed to ultraviolet light LB1 with the exposure amount that renders the hardening rate of the organic material C approximately 100%, whereas the pattern periphery region Stb will be exposed to ultraviolet light LB12 which is a part of the ultraviolet light L being transmitted through the transmissive film 220 and of which exposure amount is being the exposure amount $I_{50}$ or the exposure amount $I_{25}$ that renders the hardening rate of the organic material approximately 50% or 25%. As a result, the organic material Csa having been formed on the pattern periphery region Stb on the side of the shot region SA becomes further hardened to eventually become almost completely solidified. After that, the light source 10 stops emitting the ultraviolet light L. Then, as indicated by an arrow in FIG. 14-6, the elevation units 13 elevate the template 211 from above the organic material Csa, whereby the patterning process with respect to the shot region SB is completed.

In this way, as in the case of the nano-imprint apparatus 1 according to the first embodiment, in the nano-imprint apparatus 201 according to the present embodiment, the exposure amount of ultraviolet light with each exposure is adjusted using the difference in transmittance between the pattern formed region Sp of the template 211 and the pattern periphery region St of the template 211. Thereby, according to the present embodiment, it is possible to let the organic material applied on the pattern periphery region Sta of the substrate 14 including the shot boundary not harden completely but be kept in a soft state. As a result, downward movement of the template 211 with respect to the adjacent shots will be able to be executed appropriately. Therefore, as in the case of the nano-imprint apparatus 1, in the nano-imprint apparatus 201 also, it is possible to let the template 211 and the organic material C contract each other to a sufficient extent without having to arrange any gap between adjacent shots. Thus, it is possible to enlarge the effective area on the pattern forming surface of the substrate 14. As a result, more shots can be formed on the substrate 14 than in the conventional case.

Figure 15:
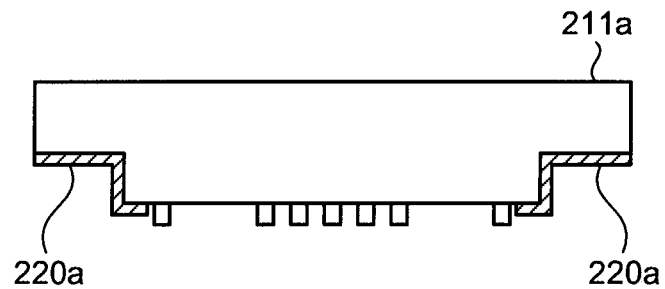
FIG. 15 is a sectional view showing another example of the template shown in FIG. 12.
Figure 16:
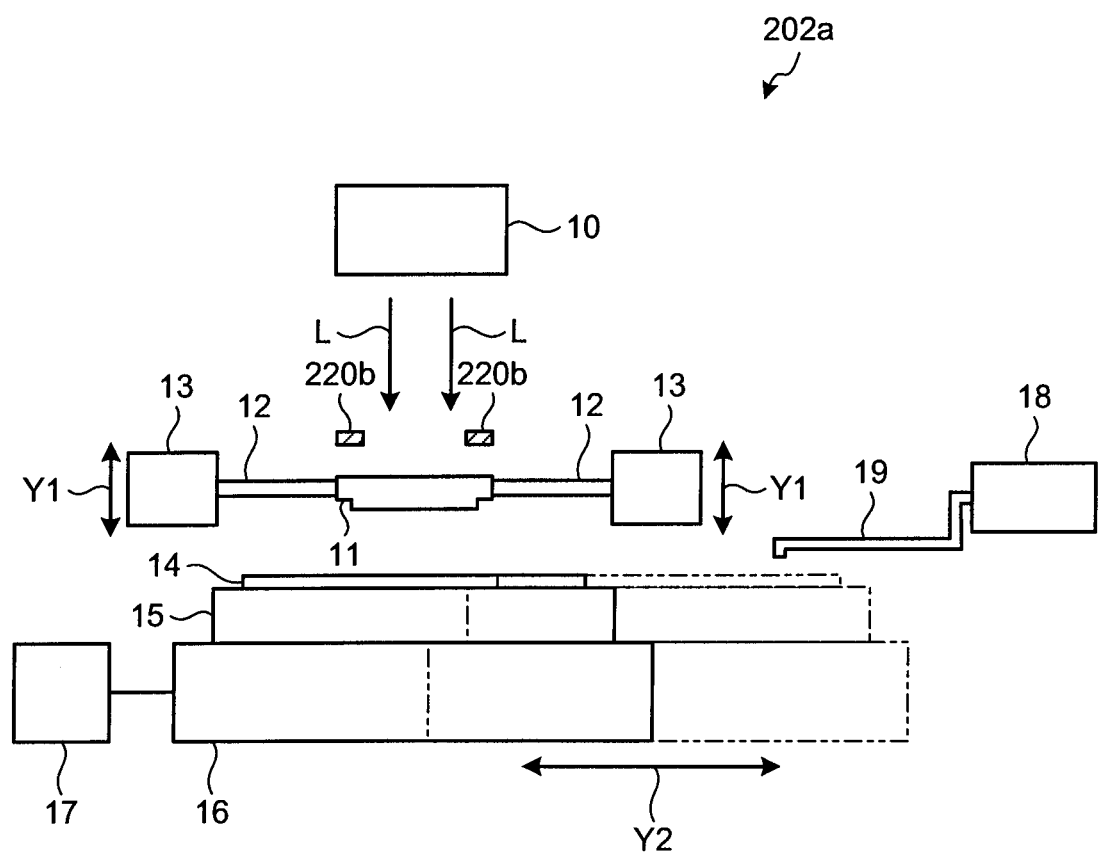
FIG. 16 is a schematic diagram showing another example of the structure of the nano-imprint machine according to the second embodiment.

In the second embodiment, although the case in which the template 211 has a structure in that the transmissive film 220 is provided directly thereon in an integrated manner has been described by way of example, the template is not limited to such structure. For example, the transmissive film can work effectively enough as long as it is arranged in an area corresponding to the pattern periphery region St2 somewhere between the light source 10 and the template 211. Therefore, as in a case of a template 211a shown in FIG. 15, a transmissive film 220a can be provided directly underneath the template 211. Furthermore, as in a case of a nano-imprint machine 202a shown in FIG. 16, a transmissive film 220b can be arranged separately above the template 11 and the template holders 12.

Moreover, eventually, by the time the patterning processes with respect to the entire shots on the substrate 14 are finished, the total exposure amount of ultraviolet light directed to the regions of the substrate 14 corresponding to the pattern periphery region of the template 211 may desirably be the exposure amount of ultraviolet light directed to the regions on the surface of the substrate 14 corresponding to the pattern formed region of the template 211, that is, the exposure amount equivalent to that enabling the hardening rate to become approximately 100%. Thereby, it is possible to eliminate the necessity to have the transmissive film 220 arranged in a way corresponding to the entire pattern periphery region St2 of the template 211. For example, the transmissive film 220 can be arranged only in a part of the pattern periphery region St2 of the template 211.

In the first and the second embodiment, there may be a possibility that, by the time the patterning processes with respect to the entire shots are completed, some regions (e.g. the pattern periphery regions which are in the shot regions at the edge parts of the substrate 14 and are on the edge side of the substrate 14) are not being exposed with enough ultraviolet light that renders the hardening rate of the organic material approximately 100%. From this perspective, it is also possible to expose the entire surface of the substrate 14 with sufficient exposure amount of ultraviolet light in order to let the organic material harden completely.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An imprint method comprising:
   providing a light-curable material on a substrate;
   contacting the light-curable material with a template, the template having a patterning surface including patterns to be transferred onto the light-curable material, the contact of the template with the light-curable material producing, in the light-curable material, a first region including a concave-convex pattern, a second region not including, a concave-convex pattern, and a third region not including a concave-convex pattern;
   exposing, through the template, the first region with a first exposure amount of light energy, the second region with a second exposure amount of light energy, and the third region with a third exposure amount of light energy, the second amount being greater than the third amount and smaller than the first amount;
   removing the template from the light-curable material;
   after removing the template, contacting a portion of one of the second region or the third region with the template for a second time; and
   exposing, through the template, the second region with a fourth exposure amount of light energy and the third region with a fifth exposure amount of light energy, the fourth amount being greater than the fifth amount;
   wherein a shutter is arranged on a surface of the template opposite the patterning surface at a position corresponding to the second and third regions.

2. The imprint method according to claim 1, further comprising controlling the exposure amounts at the light-curable material with the shutter.

3. The imprint method according to claim 2, wherein controlling the exposure amounts at the light-curable material comprises operating a shutter during the exposure.

4. The imprint method according to claim 3, wherein controlling the second exposure amount and the third exposure amount comprises operating the shutter during the exposure.

5. The imprint method according to claim 1, wherein controlling the exposure amounts comprises producing a first transmittance of the template corresponding to at least one of the second region or the third region and a second transmittance of the template corresponding to at least a concave pattern in the concave-convex pattern of the first region, the first transmittance being less than the second transmittance.

6. The imprint method according to claim 5,
comprising arranging a transmissive film on the template for reducing light transmittance of the template, the transmissive film being arranged at at least one of the second region or the third region.

7. The imprint method according to claim 1, wherein the light-curable material is the first light-curable material, the method further comprising:
providing a second light-curable material adjacent to the first light-curable material; and
contacting the second light-curable material and the portion of one of the second region or the third region with the template.

8. The imprint method according to claim 7, wherein controlling the exposure amounts comprises producing a first transmittance of the template corresponding to at least one of the second region or the third region and a second transmittance of the template corresponding to at least a concave pattern in the concave-convex pattern of the first region, the first transmittance being less than the second transmittance.

9. The imprint method according to claim 8, comprising:
arranging a transmissive film on the template for reducing light transmittance of the template, the transmissive film being arranged at at least one of the second region or the third region.

10. The imprint method according to claim 1, further comprising
exposing an entire surface of the substrate after exposing all of the shots on the substrate through the template.

* * * * *